(12) United States Patent
Direcks et al.

(10) Patent No.: US 8,259,283 B2
(45) Date of Patent: Sep. 4, 2012

(54) IMMERSION LITHOGRAPHIC APPARATUS AND DEVICE MANUFACTURING METHOD

(75) Inventors: Daniël Jozef Maria Direcks, Simpelveld (NL); Nicolaas Rudolf Kemper, Eindhoven (NL); Paulus Martinus Maria Liebregts, Veldhoven (NL); Ronald Van Der Ham, Maarheeze (NL); Wilhelmus Franciscus Johannes Simons, Beesel (NL); Danny Maria Hubertus Philips, Son en Breugel (NL); Gert-Jan Gerardus Johannes Thomas Brands, Waalre (NL); Koen Steffens, Veldhoven (NL); Han Henricus Aldegonda Lempens, Weert (NL); Marcus Johannes Van Der Zanden, Boekel (NL); Pieter Mulder, Duizel (NL)

(73) Assignee: ASML Netherlands B.V., Veldhoven (NL)

(*) Notice: Subject to any disclaimer, the term of this patent is extended or adjusted under 35 U.S.C. 154(b) by 722 days.

(21) Appl. No.: 12/408,392

(22) Filed: Mar. 20, 2009

(65) Prior Publication Data

US 2009/0237632 A1    Sep. 24, 2009

Related U.S. Application Data

(60) Provisional application No. 61/064,729, filed on Mar. 24, 2008, provisional application No. 61/193,733, filed on Dec. 19, 2008.

(51) Int. Cl.
*G03B 27/52* (2006.01)
*G03B 27/42* (2006.01)

(52) U.S. Cl. .......................................... 355/30; 355/53

(58) Field of Classification Search ............... 355/30, 355/53, 67; 250/458
See application file for complete search history.

(56) References Cited

U.S. PATENT DOCUMENTS

| | | | |
|---|---|---|---|
| 4,509,852 A | 4/1985 | Tabarelli et al. | |
| 7,388,649 B2* | 6/2008 | Kobayashi et al. | 355/53 |
| 7,397,157 B2* | 7/2008 | Maekawa et al. | 310/114 |
| 8,054,472 B2* | 11/2011 | Shibazaki | 356/620 |
| 2004/0136494 A1 | 7/2004 | Lof et al. | |
| 2004/0207824 A1 | 10/2004 | Lof et al. | |
| 2005/0259232 A1 | 11/2005 | Streefkerk et al. | |
| 2006/0087630 A1 | 4/2006 | Kemper et al. | |
| 2006/0119809 A1 | 6/2006 | Verhagen et al. | |
| 2006/0119818 A1 | 6/2006 | Nagasaka | |
| 2007/0291241 A1* | 12/2007 | Sakai et al. | 355/53 |
| 2008/0212046 A1 | 9/2008 | Riepen et al. | |
| 2009/0147227 A1 | 6/2009 | Steffens et al. | |

FOREIGN PATENT DOCUMENTS

| | | |
|---|---|---|
| EP | 1420300 A2 | 5/2004 |
| JP | 2005-333134 | 12/2005 |
| JP | 2006-060223 | 3/2006 |
| JP | 2006-120941 | 5/2006 |
| JP | 2007-109741 | 4/2007 |
| JP | 2007-142366 | 6/2007 |
| WO | 99/49504 A1 | 9/1999 |
| WO | 2005/064405 A2 | 7/2005 |

OTHER PUBLICATIONS

Japanese Office Action mailed Aug. 2, 2011 in corresponding Japanese Patent Application No. 2009-065329.

* cited by examiner

*Primary Examiner* — Hung Henry Nguyen
(74) *Attorney, Agent, or Firm* — Pillsbury Winthrop Shaw Pittman LLP

(57) ABSTRACT

An immersion lithographic apparatus is described in which a droplet removal device removes droplets from the substrate, e.g. during exposures, using an angled flow of gas from a gas knife.

24 Claims, 10 Drawing Sheets

-- PRIOR ART --

-- PRIOR ART --

IMMERSION LITHOGRAPHIC APPARATUS AND DEVICE MANUFACTURING METHOD

This application claims priority and benefit under 35 U.S.C. §119(e) to U.S. Provisional Patent Application Ser. No. 61/064,729, entitled "Immersion Lithographic Apparatus and Device Manufacturing Method", filed on Mar. 24, 2008, and to U.S. Provisional Patent Application Ser. No. 61/193,733, entitled "Immersion Lithographic Apparatus and Device Manufacturing Method", filed on Dec. 19, 2008. The contents of those applications are incorporated herein in their entirety by reference.

FIELD

The present invention relates to a liquid removal device, in particular that can be used in or in conjunction with lithographic apparatus, as well as methods for liquid removal and device manufacture.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid is, for example, distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly useful. The point of this is to enable imaging of smaller features since the exposure radiation will have a shorter wavelength in a liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable are hydrocarbon, such as an aromatic e.g. Decalin, and a fluorohydrocarbon, and an aqueous solution.

Submersing the substrate or substrate and substrate table in a bath of liquid (see, for example, U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, structure or apparatus. In an embodiment the fluid handling system may supply immersion fluid or liquid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet IN onto the substrate, preferably along the direction of movement of the substrate relative to the final element, and is removed by at least one outlet OUT after having passed under the projection system PS. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet IN with an outlet OUT on either side are provided in a regular pattern around the final element.

A further immersion lithography solution with a localized liquid supply system is shown in FIG. 4. Liquid is supplied by two groove inlets IN on either side of the projection system PS and is removed by a plurality of discrete outlets OUT arranged radially outwardly of the inlets IN. The inlets IN and outlets OUT can be arranged in a plate with a hole in its center and through which the projection beam is projected. Liquid is supplied by one groove inlet IN on one side of the projection system PS and removed by a plurality of discrete outlets OUT on the other side of the projection system PS, causing a flow of a thin film of liquid between the projection system PS and the substrate W. The choice of which combination of inlet IN and outlets OUT to use can depend on the direction of movement of the substrate W (the other combination of inlet IN and outlets OUT being inactive).

In European patent application publication no. EP 1420300 and United States patent application publication no. US 2004-0136494, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication no. WO 2005/064405 discloses an all wet arrangement in which the immersion liquid is unconfined. In such a system the whole top surface of the substrate is covered in liquid. This may be advantageous because then the whole top surface of the substrate is exposed to substantially the same conditions. This may have an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Evaporation of the immersion liquid may occur in such a system. A way of helping to alleviate that problem is described in United States patent application publication no. US 2006/119809 in which a member is provided which covers the substrate in all positions and which is arranged to have immersion liquid extending between it and the top surface of the substrate and/or substrate table which holds the substrate.

SUMMARY

In forms of immersion lithographic apparatus using an immersion liquid, droplets or a film of liquid may be left on the substrate, for example, after a localized liquid region has passed or when the substrate is removed from the exposure station. If left to evaporate, such undesired liquid (i.e., the film and/or droplets) may cause localized cooling, and hence deformation, of the substrate and dissolved or suspended contaminants may be deposited on the substrate. Such undesired liquid may be a source of defectivity (i.e. defect count density) in attracting contaminants. If a localized liquid confinement system is employed, an additional problem may arise in that bubbles may form, for example in the immersion liquid between the substrate surface and the projection system, when undesired liquid on the substrate surface contacts and impacts the meniscus of the immersion fluid under the projection system. The undesired liquid may be stationary relative to the substrate or move relative to the liquid confinement system. The risk of collision between the undesired liquid on the substrate surface and the meniscus may increase after a change of direction of motion between the substrate and the liquid confinement system, for example when changing scanning direction. Undesired liquid may be removed using a gas flow to drag such liquid towards an extraction inlet however the high speed gas flows in such an arrangement may lead to increased evaporation, thus exacerbating the associated cooling.

It is desirable, for example, to provide an apparatus by which liquid droplets and/or film can be more effectively removed from the surface of the substrate, and a gas knife device with better performance.

According to an aspect of the invention, there is provided an immersion lithographic apparatus comprising:
a substrate table constructed to hold a substrate;
a projection system configured to project a patterned radiation beam onto a target portion of the substrate;
a liquid handling structure for supplying and at least partly confining a liquid to a space between the projection system and the substrate and/or substrate table; and
a device for removing liquid from the substrate and/or substrate table, the device comprising:
a body having a face arranged to be positioned proximate to and opposing a surface of the substrate and/or substrate table, wherein the body defines a first conduit and a second conduit, both opening in the face, the first conduit, the second conduit, or both the first conduit and the second conduit, having a part at the opening thereof that is arranged at an acute angle to a normal to the face, and
fluid conduits connecting each of the first and second conduits to a vacuum source, a gas source, or both a vacuum source and a gas source,
wherein the device for removing liquid is positioned in the apparatus so that it can remove liquid from a part of the substrate and/or substrate table at the same time that the patterned radiation beam is projected onto the substrate.

According to an aspect of the invention, there is provided a device manufacturing method comprising:
projecting an image of a pattern onto a substrate through a liquid confined to a space adjacent the substrate, and
simultaneously removing liquid from the substrate and/or substrate table using a flow of gas directed to onto the substrate at an acute angle to the substrate and/or substrate table.

According to an aspect of the invention, there is provided an immersion lithographic apparatus comprising:
a liquid handling structure for supplying and at least partly confining liquid to a space between a projection system and a substrate and/or a substrate table, the substrate table constructed to hold the substrate and the projection system configured to project a patterned radiation beam onto a target position of the substrate; and
a device configured to remove liquid from a surface of the substrate and/or substrate table, the device defining first and second conduits, each of the first and second conduits defining an opening in a face, the face being arranged to be positioned proximate to and opposing the surface of the substrate and/or substrate table, wherein each of the first and second conduits at its opening is angled away from the other of the first and second conduits and the face and the first conduit, the second conduit, or both the first and second conduits, being selectively connectable to each of a vacuum source and a gas source.

According to an aspect of the invention, there is provided a liquid remover configured to remove liquid from a surface of a substrate and/or a substrate table, the liquid remover defining first and second conduits, each of the first and second conduits defining an opening in a face, the face being arranged to be positioned proximate to and opposing a surface of the substrate and/or substrate table,
wherein each of the first and second conduits, at its respective opening, is angled away from the other of the first and second conduits and the face, and
the first conduit, the second conduit, or both the first and second conduits, being selectively connectable to each of a vacuum source and a gas source.

According to an aspect of the invention, there is provided an immersion lithographic apparatus comprising:
a liquid handling structure for supplying and at least partly confining liquid to a space between a projection system and a substrate and/or a substrate table, the substrate table constructed to hold the substrate and the projection system configured to project a patterned radiation beam onto a target position of the substrate, the structure comprising first and second conduits radially outwardly of the space, each of the first and second conduits defining an opening in an undersurface of the structure, wherein each of the first and second conduits at its opening is angled away from the other of the first and second conduits and the undersurface and is selectably connectable to a vacuum source, a gas source or both a vacuum source and a gas source, to remove liquid from a surface of the substrate and/or substrate table opposing the undersurface.

According to an aspect of the invention, there is provided a liquid handling structure configured in use to supply and at least partly confine liquid to a space between a projection system and a substrate and/or a substrate table, the substrate table constructed to hold the substrate and the projection system configured to project a patterned radiation beam onto a target position of the substrate, the structure comprising first and second conduits radially outwardly of the space, each of the first and second conduits defining an opening in an undersurface of the structure, wherein each of the first and second conduits, at its respective opening, is angled away from the other of the first and second conduits and the undersurface and is selectably connectable to a vacuum source, a gas source, or both a vacuum source and a gas source, to remove liquid from a surface of the substrate and/or substrate table opposing the undersurface.

According to an aspect of the invention, there is provided a lithographic apparatus comprising:

a dryer, wherein the dryer is configured to remove liquid from a surface of a substrate and/or a substrate table, the dryer comprising first and second conduits, each conduit defining an opening in a face, the face being arranged to be positioned proximate to and opposing the surface of the substrate and/or substrate table, wherein each of the first and second conduits at its opening is angled away from the other of the first and second conduits and the face and is selectably connectable to a vacuum source and a gas source.

According to an aspect of the invention, there is provided a dryer configured to remove liquid from a surface of a substrate and/or a substrate table, the dryer comprising first and second conduits, each conduit defining an opening in a face, the face being arranged to be positioned proximate to and opposing the surface of the substrate and/or substrate table, wherein each of the first and second conduits at its opening is angled away from the other of the first and second conduits and the face and is selectably connectable to each of a vacuum source and a gas source.

According to an aspect of the invention, there is provided an immersion lithographic apparatus comprising:

a substrate table constructed to hold a substrate;

a projection system configured to project a patterned radiation beam onto a target portion of the substrate;

a liquid handling structure for supplying and at least partly confining a liquid to a space between the projection system and the substrate and/or substrate table; and a device for removing liquid from the substrate and/or substrate table, the device comprising:

a first conduit and a second conduit each of the first and second conduits having a nozzle part having a fluid channel therethrough, the nozzle of at least one of the first and second conduits being arranged such that a center line of the fluid channel thereof is at an acute angle to a normal to a surface of the substrate and/or substrate table, and fluid conduits connecting each of the first and second conduits to a vacuum source, a gas source, or both a vacuum source and a gas source, wherein the device for removing liquid is positioned in the apparatus so that it can remove liquid from a part of the substrate and/or substrate table at the same time that the patterned radiation beam is projected onto the substrate.

According to an aspect of the invention, there is provided a lithographic apparatus comprising a body configured to be positioned proximate to and opposing a surface of a substrate and/or a substrate table, the substrate table constructed to hold a substrate, the body comprising:

a gas knife device configured to manipulate fluid on the surface of the substrate and/or substrate table; and a retractor configured to retract the gas knife device into the body on de-activation of the gas knife device.

According to an aspect of the invention, there is provided a gas knife device arranged to direct a gas flow against an object surface, the gas knife device comprising a first member and a second member, the first and second members being separated by a gap that defines an orifice through which gas flows to form the gas knife, wherein the orifice is oriented at an acute angle to the normal to the object surface.

According to an aspect of the invention, there is provided an immersion lithographic apparatus comprising:

a substrate table constructed to hold a substrate;

a projection system configured to project a patterned radiation beam onto a target portion of the substrate; and a liquid handling structure configured to supply and at least partly confine a liquid to a space between the projection system and the substrate and/or substrate table, the liquid handling structure including the above gas knife device.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
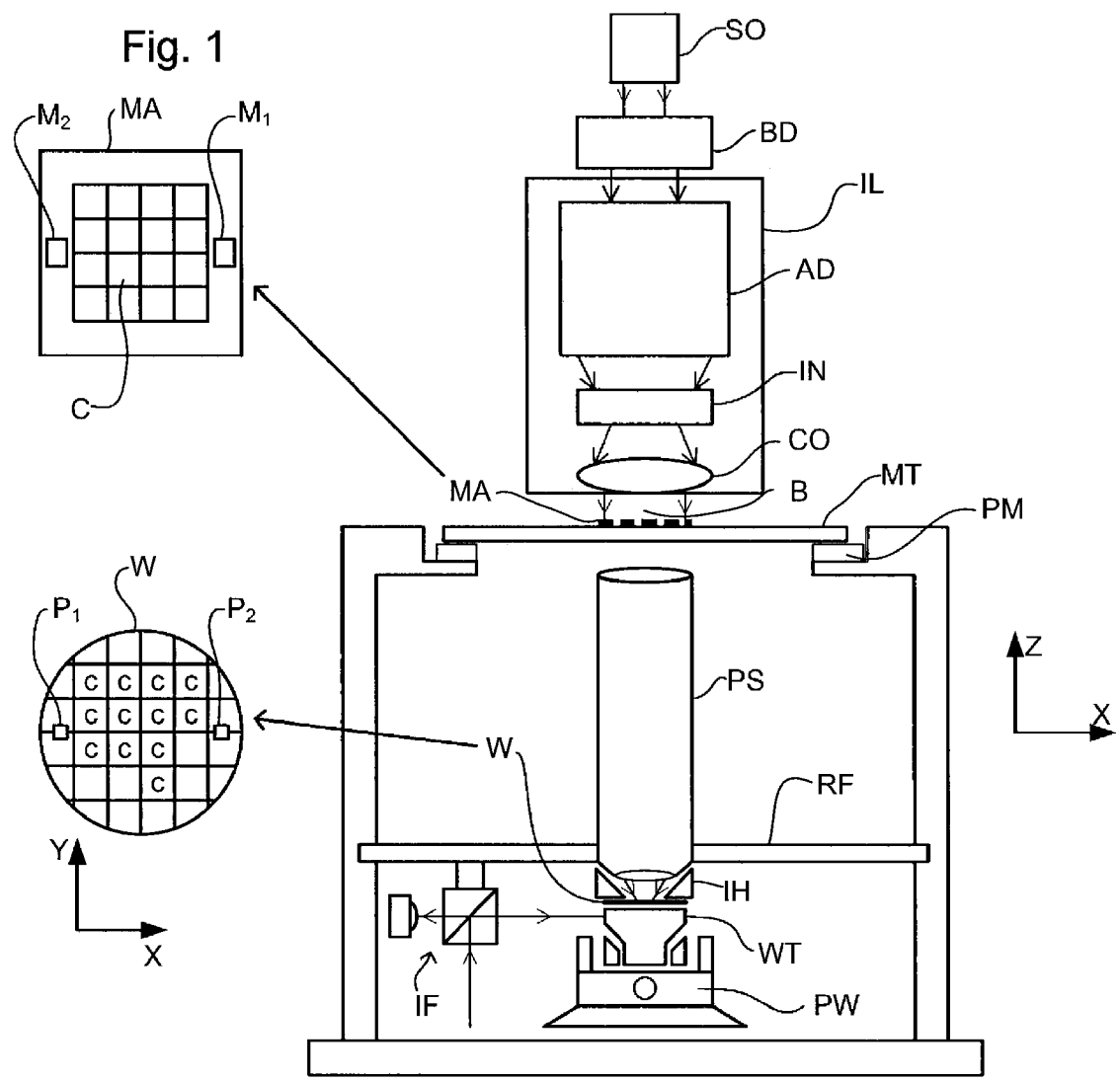
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising, for example, suitable directing mirrors and/or a beam expander. In other cases the source SO may be an integral part of the lithographic apparatus, for example when the source SO is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam B onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
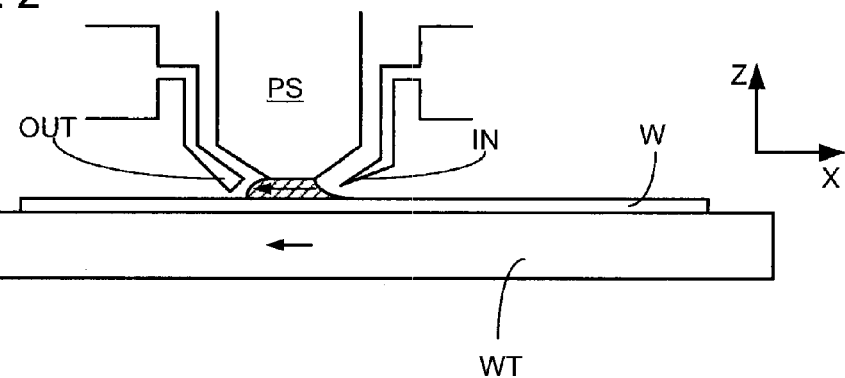
FIGS. 2 and 3 depict a structure configured to supply and at least partly confine liquid used in a lithographic projection apparatus.
Figure 3:
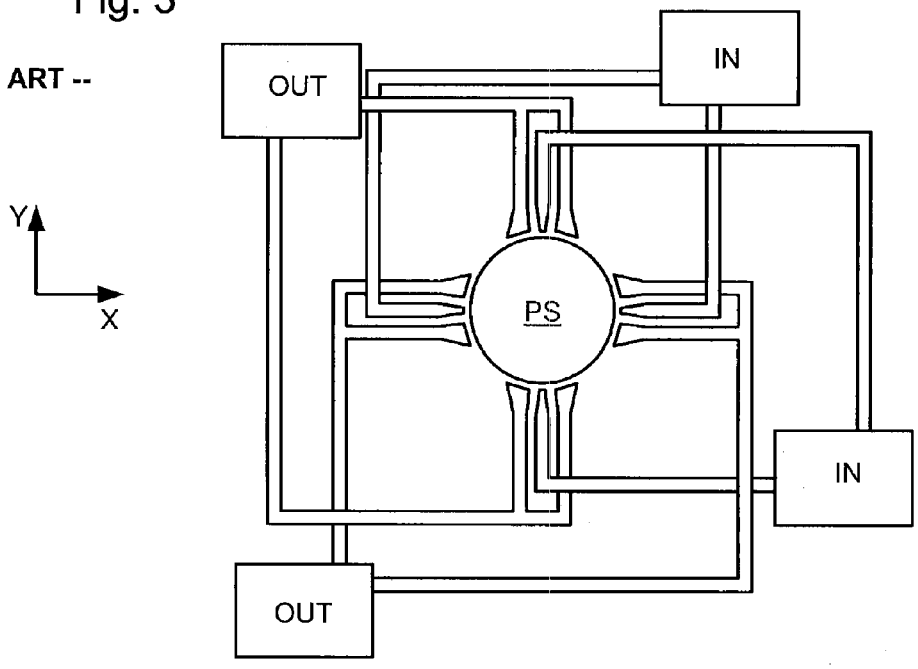
Figure 4:
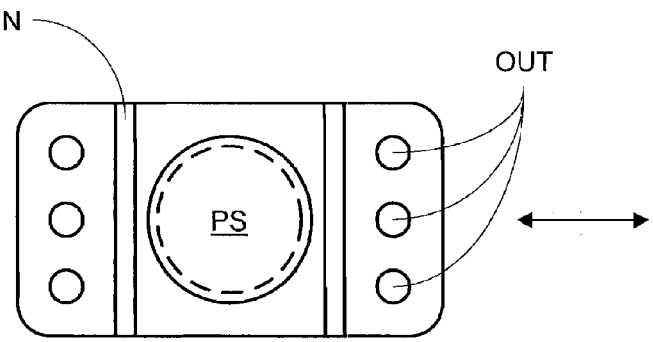
FIG. 4 depicts a further structure configured to supply and at least partly confine liquid in a lithographic projection apparatus.
Figure 4:
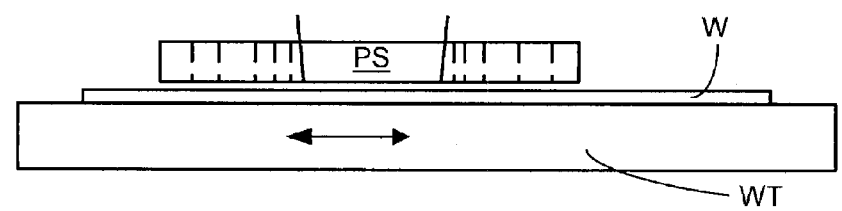
Figure 5:
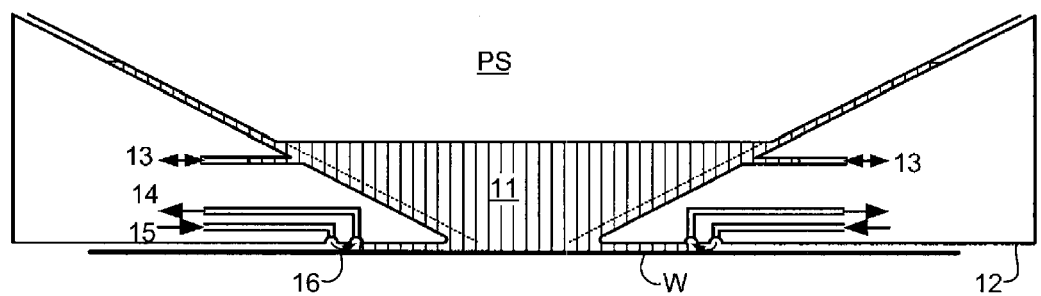
FIG. 5 depicts, in cross-section, a barrier member which may be used in an embodiment of the present invention as a structure configured to supply and at least partly confine liquid.

FIG. 5 schematically depicts a localized immersion system having a structure to supply and to at least partly confine immersion liquid to a space 11 between the final element of the projection system PS and the substrate W. It is a further embodiment to the other localized immersion systems shown in FIGS. 2 to 4 and described above. The immersion system of FIG. 5 has a barrier member 12, which extends along at least a part of a boundary of the space 11 between the final element of the projection system PS and the substrate table W. The barrier member 12 is substantially stationary relative to the projection system PS in the XY plane though there may be some relative movement in the Z direction (in the direction of the optical axis). In an embodiment, a seal is formed between the barrier member 12 and the surface of the substrate W and may be a contactless seal such as a gas seal or fluid seal.

The barrier member 12 is a structure which may at least partly contain liquid in the space 11 between a final element of the projection system PS and the substrate W. A contactless seal, such as a gas seal 16, to the substrate W may be formed around the image field of the projection system PS so that liquid is confined within the space 11 between the substrate surface and the final element of the projection system PS. The space 11 is at least partly formed by the barrier member 12 positioned below and surrounding the final element of the projection system PS. Liquid is brought into the space 11 below the projection system PS and within the barrier member 12 by liquid inlet 13 and may be removed by liquid outlet 13. The barrier member 12 may extend a little above the final element of the projection system PS. The liquid level may rise above the final element so that a buffer of liquid is provided. The barrier member 12 has an inner periphery that at the upper end, in an embodiment, closely conforms to the shape of the projection system PS or the final element thereof and may, e.g., be round. At the bottom, the inner periphery closely conforms to the shape of the image field, e.g., rectangular, though this need not be the case.

The liquid is contained in the space 11 by the gas seal 16 which, during use, is formed between the bottom of the barrier member 12 and the surface of the substrate W. The gas seal 16 is formed by gas, e.g. air or synthetic air. In an embodiment, $N_2$ or another inert gas, is provided under pressure via inlet 15 to the gap between barrier member 12 and substrate W. The gas may be extracted via outlet 14. The overpressure on the gas inlet 15, vacuum level on the outlet 14 and geometry of the gap are arranged so that there is a high-velocity gas flow inwards that confines the liquid. The force of the gas on the liquid between the barrier member 12 and the substrate W contains the liquid in the space 11. Those inlets/outlets may be annular grooves which surround the space 11. The annular grooves may be continuous or discontinuous. The flow of gas is effective to contain the liquid in the space 11. Such a system is disclosed in United States patent application publication no. US 2004-0207824, incorporated herein by reference.

In localized immersion systems, liquid is only provided to a localized area of the substrate W. The space 11 filled by liquid, i.e. the reservoir, is smaller in plan than the top surface of the substrate W. The reservoir remains substantially stationary relative to the projection system PS whilst the substrate W moves underneath it. Another category of immersion system is the bath type arrangement in which the whole of the substrate W and optionally part of the substrate table WT is submersed in a bath of liquid. A further category is an all wet solution in which the liquid is unconfined. In this arrangement the whole top surface of the substrate W and optionally all or part of the substrate table WT is covered in a thin film of immersion liquid. Any of the liquid supply devices of FIGS. 2 to 5 may be used in such an all wet system; however, their sealing features are not present, are not activated, are not as efficient as normal or are otherwise ineffective to seal liquid to only the localized area.

Other arrangements are possible and, as will be clear from the description below, an embodiment of the present invention may be implemented in any type of localized liquid supply system as the liquid supply system.

As discussed above, an immersion system using an immersion liquid may leave immersion liquid, e.g. water, on the substrate after or during exposures. Such undesired liquid may be in the form of one or more droplets and/or a film. A large droplet may be considered a liquid film localized to a point on a surface. In an unconfined immersion system, the liquid may be in the form of a plurality of droplets, for example on a surface having a high contact angle (e.g., a hydrophobic surface). Each droplet may move independently of the liquid in the reservoir. Where the contact angle of the liquid with the surface is lower, or there is greater quantity of liquid, the droplet is larger to the extent that it is non-localized. The droplet may then be considered a liquid film. A liquid film may be present for a liquid with a lower surface tension, such as a liquid other than water.

Undesired liquid such as this may cause one or more problems. Evaporation of undesired liquid may cause localized cooling and therefore thermal distortion of the substrate. Particles and other contaminants may be attracted to and collect in the undesired liquid. Undesired liquid that evaporates may leave behind a drying ring and contaminating particles. Undesired liquid may interact with resist on the substrate and may cause pattern defects. When undesired liquid is left behind by a localized immersion system it may subsequently be swept up by it and collide with a meniscus of liquid in the reservoir, for example after a change in direction of relative motion between the substrate table and the immersion system. A bubble may then be generated in the liquid under the projection system. Vapor from evaporated undesired liquid may affect a sensor such as an interferometric position sensor. Therefore, an embodiment of the present invention provides a liquid removal device (or a liquid remover) that is more effective at removing undesired liquid from the substrate surface. Specifically, an embodiment of the invention provides a droplet removal device (or a droplet remover). An embodiment of the present invention may reduce evaporation of undesired liquid.

An embodiment of the invention may be applied to the surface of the substrate table WT and/or a surface of a component located in the surface of the substrate table WT, for example, a shutter member (e.g. a closing disk or portion of the substrate table) or a sensor. Undesired immersion liquid may be present on one or more of these surfaces. Undesired liquid may be removed from a surface of the substrate table WT using an embodiment of the invention. For this reason, a reference to the surface of the substrate W also refers to the surface of the substrate table WT and a surface of a component located in the substrate table WT, unless expressly stated to the contrary.

In the description and figures herein, the embodiments primarily refer to and depict droplets. However, it should be understood that the embodiments herein may equally be applied to other liquid forms, and thus the embodiments herein should more generally be viewed as a liquid removal device or remover for undesired liquid (such as droplets).

Figure 6:
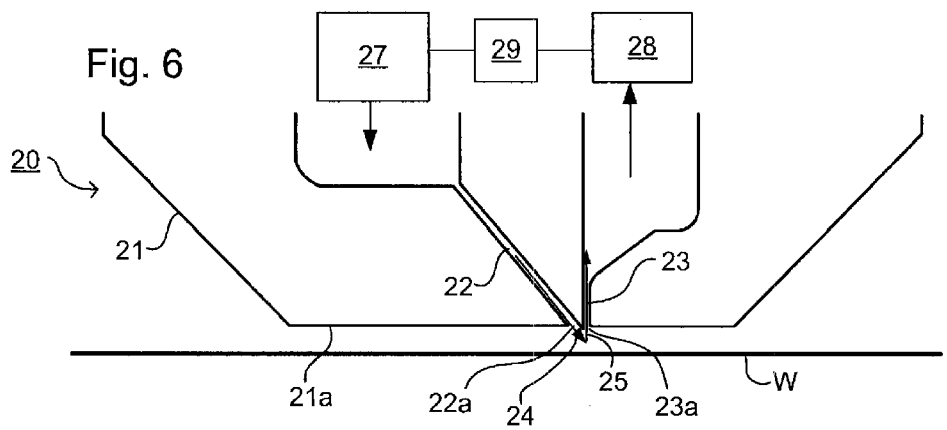
FIG. 6 depicts in cross-section a droplet removal device according to an embodiment of the invention.

A droplet remover 20 according to an embodiment of the present invention is shown in FIG. 6. It comprises a body 21 in which are formed two conduits 22 and 23. Each conduit has an opening 22a, 23a defined in an undersurface 21a of the body 21. The openings are adjacent each other. The undersurface may be generally flat and, in use, may be generally parallel with the opposing substrate surface. Note that a configuration of an embodiment of the invention may still work effectively when the body is tilted with respect to the substrate W, for example, within the range of zero to five degrees.

One of the openings 22a, 23a is an inlet which is connected to a supply 27 of gas (e.g. air, particularly extremely clean dry air (XCDA); or an inert gas such as nitrogen, helium or argon). The gas supply 27 operates to provide a gas flow. One of the openings 22a, 23a is an outlet connected to a vacuum source 28, e.g. a vacuum pump. The vacuum source 28 may operate to provide an under pressure. The openings 22a, 23a may be discontinuous or continuous. Each conduit 22, 23 may define a slit in the body 21. The conduits may be spaced apart from each other. So the openings 22a and 23a may be spaced apart from each other in the undersurface 21a.

Each conduit 22, 23 may be angled with respect to and away from the undersurface 21a. For example, each conduit 22, 23 may be acutely angled with respect to the normal from the undersurface 21a. The angle of a conduit 22, 23 may be defined with respect to the median of a part of the conduit near its respective opening 22a, 23a. The conduits 22, 23 may be aligned so that they are angled with respect to each other, desirably acutely and away from each other with distance from the undersurface 21a. The angles between the conduits 22, 23 may be between 0 and 70 degrees with respect to each other, so that they may be parallel with respect to each other. One of the conduits 22, 23 may be angled between 85 and 95 degrees with respect to the undersurface 21a, and it may be perpendicular to the undersurface 21a. As the undersurface 21a is generally parallel to the surface of the substrate W, the comments about the relative angles of the conduits 22 and 23 may be with reference to the substrate W. However, where the substrate W is not parallel to the undersurface 21a, the relative angles of the conduits 22, 23 may be defined with respect to the surface of the substrate W instead of the undersurface 21a. Alternatively, the angles of the conduits 22, 23 may be taken as the median angles of the gas (e.g., air) flows into or out of them.

In the embodiment shown in FIG. 6, conduit 22 is acutely angled to undersurface 21a. Conduit 23 is substantially normal to undersurface 21a, desirably it is angled up to 5 degrees away from the vertical and away from the conduit 22 (as shown, for example, in FIG. 7). When the droplet remover is placed in close proximity above a substrate W and operated, a gas flow exits opening 22a in a stream 24. A gas flow flows enters opening 23a under the influence of an under pressure. Opening 23a is at an under pressure by virtue of the vacuum source 28. That is, the stream 24 passes through a gas knife inlet, opening 22a, and gas flows out of an extractor outlet, opening 23a. Opening 22a is thus a gas flow inlet to the region below the droplet remover 20. Opening 23a is an outlet to the gas flow.

The stream 24 is angled with respect to the surface of the substrate W and is directed towards the opening 23a. The gas flow through the opening 23a causes an under pressure to form in the region around the opening 23a. In use, the substrate W moves relative to the droplet remover 20. In FIG. 6, for example, the surface of the substrate W would move to the right side of the figure relative to the droplet remover 20. The droplet remover 20 would remove a droplet as it passes the openings 22a, 23a.

A droplet present on the surface of the substrate W beneath the droplet remover 20 would encounter the stream 24 exiting from opening 22a and the under pressure around the opening 23a. The openings 22a and 23a are located relative to each other so that a droplet encountering them will be extracted through the conduit 23. The stream 24 is directed to an area of the substrate surface beneath the droplet remover 20; this area is called here an 'extractor area'. The extractor area is positioned relative to the opening 23a so that a droplet in the extractor area interacts with the under pressure around the opening 23a. In one embodiment the extractor area may be directly beneath the opening 23a. The stream 24 interacts with the droplet present on the substrate surface to stop, or at least substantially slow, the droplet in the extractor area so that droplet interacts with under pressure in the region around the opening 23a. The droplet is extracted through the opening 23a, as indicated by arrow 25. The stream 24 increases the efficiency of extracting a droplet. The new arrangement increases the time a droplet can interact with an extracting under pressure for a certain rate of relative movement between the substrate and the droplet remover 20. A liquid trap (not shown) may be provided downstream of the conduit 23 to capture extracted liquid to prevent it reaching the vacuum source.

The droplet remover 20 is particularly effective at removing droplets in a region below conduit 23, enabling the rapid extraction of the droplets. This is because conduit 22 is at an angle relative to the substrate W in use and generates a gas flow towards the extractor area. In an embodiment, the droplet remover 20 may be moved relative to the substrate W (e.g. scanned), over the surface of the substrate W to remove all, or most of, the droplets present. Such scanning may be achieved by moving either, or both of, the droplet remover 20 and the substrate W by a suitable positioning device (not shown). As illustrated in FIG. 6, the droplet remover 20 may be moved relative to the substrate W to the left (in other words the substrate W is moved to the right) so that droplets are extracted through the extraction opening 23a. In an embodiment, in the event that a droplet passes the extraction opening 23a it may still be stopped, or even pushed back towards, the region beneath the extraction opening 23a by the stream 24.

The angle of the angled conduit 22 may be determined in a particular application according to relevant factors, such as the fluid and droplet size to be removed, the supply overpressure and extraction under pressure, and/or the operating height of the device. In an embodiment, the angle between the median of the conduit 22 near its opening 22a and the normal to the surface 21a may be in the range of from 0 to 65°, from 10 to 55° or from 20 to 45°. Another particular embodiment has an angle in the range of from 15 to 45°.

The performance a conduit functioning as an extractor may not be directly related to the angle of the conduit relative to the normal of the undersurface 21a. The performance of a conduit supplying gas may be more dependent on the angle of the conduit relative to normal to the undersurface 21a. It may be important because the angle of the conduit could determine the form of the overpressure mount created by the gas supply provided through the opening of the conduit. If the angle is too great the pressure mount may be too broad and may not be sharp enough to stop or slow the droplet. The droplet remover 20 might not effectively interact with the associated under pressure and be extracted.

Depending on the application and the same relevant factors as for the angle of the conduit 22, the rate of the gas flow through the inlet (opening 22a) and/or the outlet (opening 23a) may be varied. The gas supply 27 and/or the vacuum source 28 may be connected to a controller 29. The rate of flow of gas through the inlet and/or the size of the under pressure may be varied to alter the performance of the droplet remover 20. The variation in these features may be achieved by a controller and even exchange the functions of the conduits 22 and 23, i.e. from supplying gas to extracting gas, and vice versa. To ensure reliable performance, the rate of gas supply through the inlet is the same as or desirably greater than the flow rate through the outlet.

In an embodiment, the openings of the conduits 22 and 23 are radially outward of an extractor outlet 14 used to define a meniscus of liquid in the space 11.

Figure 7:
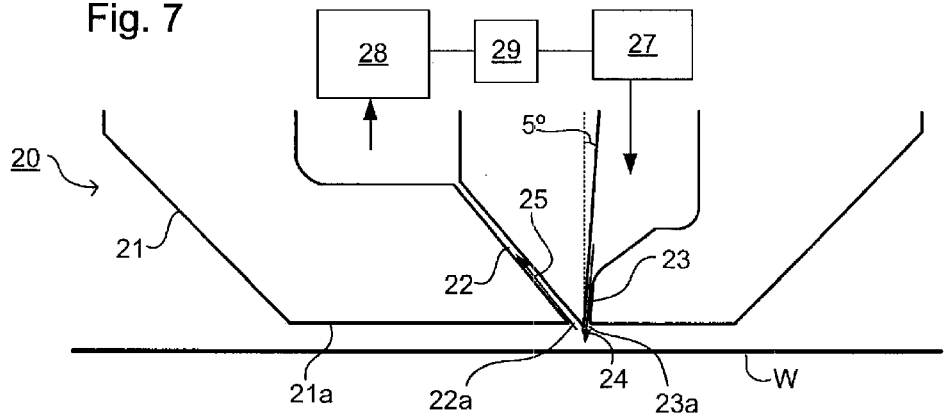
FIG. 7 depicts in cross-section a droplet removal device according to a further embodiment of the invention.

In a variant of the embodiment shown in FIG. 7, the functions of the conduits 22, 23 are changed, so that the opening 23a is gas flow inlet and the opening 22a is an extraction outlet. The variant has otherwise the same features as described above. The controller may be operated to change the functions of the openings 22a, 23a. Thus, for example in this variant, a conduit 22 functioning as an extractor is angled acutely with respect to the normal from the undersurface 21a.

Figure 8:
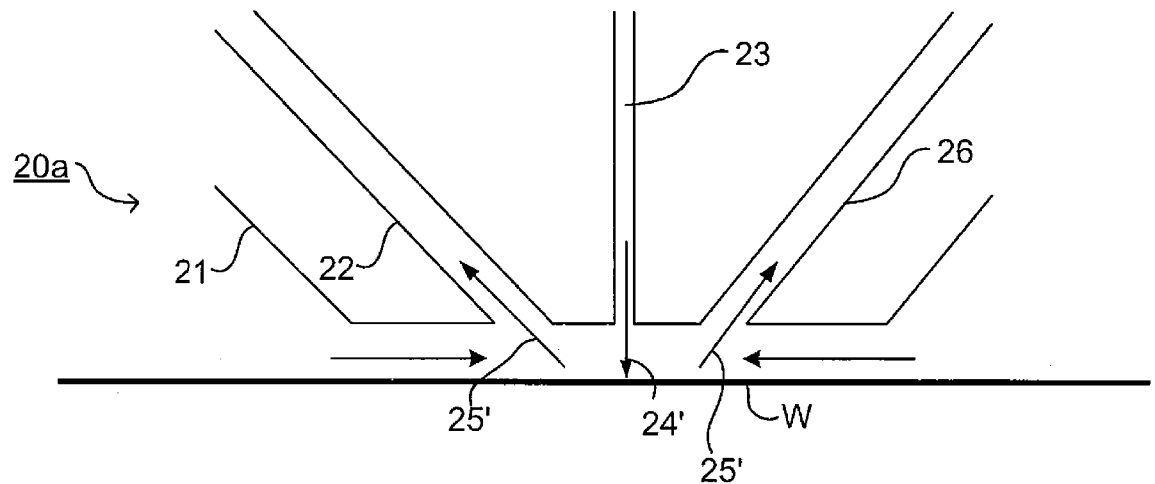
FIG. 8 depicts in cross-section a droplet removal device according to a further embodiment of the invention.
Figure 9:
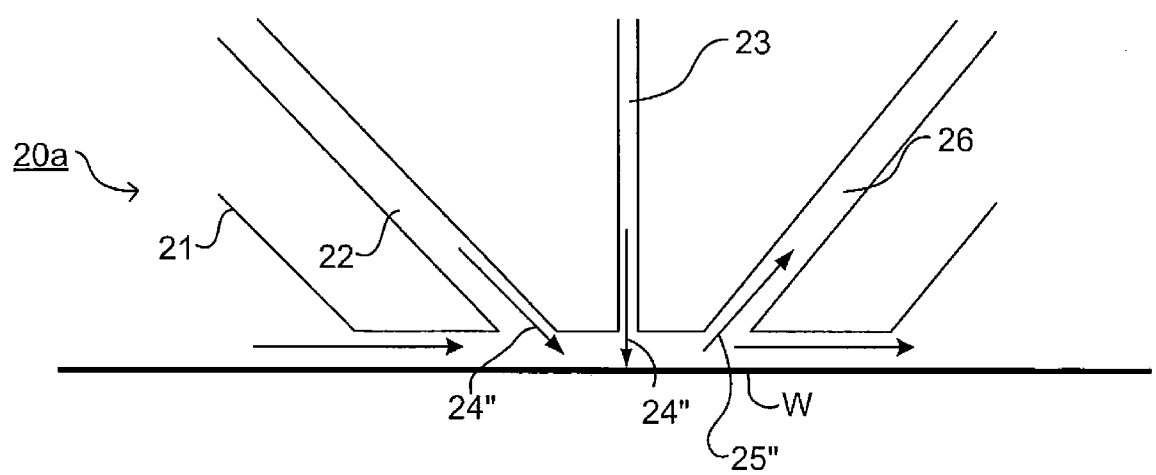
FIG. 9 depicts in cross-section a droplet removal device according to a further embodiment of the invention.

A variant of the droplet remover 20a is shown in FIGS. 8 and 9. In these droplet removers, a third conduit 26 is provided. The third conduit 26 has an opening 26a defined in the undersurface 21a. The median of the third conduit 26 in a part of the conduit near the opening 26a may be angled with respect to the other conduits 22, 23 and the undersurface 21a. At least one of the conduits 22, 23, 26 is connected to the gas supply 27. At least one of the conduits 22, 23, 26 may be connected to the vacuum source 28. The gas supply 27 and the vacuum source 28 may be connected to a controller. The controller may be operated to control the rate of gas flow through each conduit 22, 23, 26 and/or the modes of operation of the opening of each conduit 22, 23, 26: as an extractor outlet, as gas inlet or non-operational. The conduits 22, 23, 26 are angled with respect to each other in any configuration, so that gas flowing through each conduit 22, 23, 26 may interactively control and extract a droplet present on substrate W as it passes underneath the droplet remover 20. That is, a droplet in an extraction area of a gas inlet may interact with an under pressure formed around an extraction outlet. In one embodiment, two or more of the conduits 22, 23, 26 may be parallel with each other. One or more of the conduits 22, 23, 26 may be perpendicular to the undersurface 21a.

In one embodiment, as shown in FIGS. 8 and 9, one conduit 23 is perpendicular to the undersurface and one is acutely angled with respect to the undersurface on one side of the perpendicular conduit. The third conduit 26 is on the other side of the perpendicular conduit 23 from the angled conduit 22 and oppositely inclined. This variant can be operated in different modes. In each different mode of operation, different ones of the openings 22a, 23a and 26a supply gas or extract liquid (from a droplet) and/or gas. For example, as shown in FIG. 7 the two angled conduits 22, 26 may be connected to the vacuum source 28 so as to extract gas and liquid in the direction of arrow 25' whilst the middle, perpendicular conduit 23 supplies gas to form a gas knife 24'. This has the effect that whichever the direction of the relative movement between the substrate W and droplet remover 20a, a droplet encountered on the substrate surface underneath one of the extraction openings, or in an extraction area under the influence of the under pressure, is removed. If the substrate W is moving leftwards in the figure, the gas flow of the gas knife 24' will slow or stop the droplet so that the under pressure may extract it through the extraction outlet, opening 26a, as shown by arrow 25'. The gas flow of the gas knife 24' could slow the droplet, but not enough for the gas flow though opening 26a to extract the droplet. As the gas flow of the gas knife 24' interacts with the droplet it may flatten it. Once on the other side of the gas flow of the gas knife 24', the droplet may interact with the under pressure in the region around the opening 22a and so be removed. If the substrate W is moving relative to the droplet remover 20a in the other direction, i.e. rightwards in the figure, the process would be reversed: the droplet could be removed through opening 22a. If it is not removed, it may then be removed through the opening 26a.

Another mode of operation of this droplet remover 20a is shown in FIG. 9. This mode has one of the angled conduits 22, 26, here the conduit 22, and the perpendicular conduit 23 each supplying gas. The remaining angled conduit, here the third conduit 26, is used for extraction in the direction 25". This arrangement creates a large gas flow towards the opening 26a of the extracting conduit 26 for effective removal of droplets. Desirably the arrangement is used when the substrate W is moved leftwards in the figure relative to the droplet remover 20a. The angled stream 24" of gas increases the pressure mount created by the gas flow from the perpendicular conduit 23. The arrangement helps ensure a droplet may not pass the pressure mount. A droplet that passes the pressure mount created by the gas flowing through the perpendicular conduit 23 is swept back towards the extraction outlet by the gas flowing through the opening 22a of the angled conduit 22.

Figure 10A:
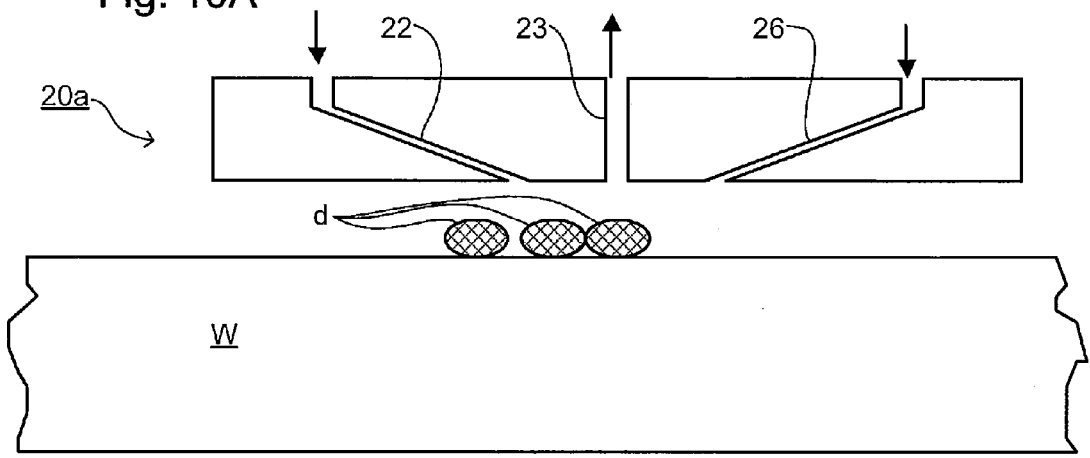
FIGS. 10A to C depict in cross-section a droplet removal device according to a further embodiment of the invention and show its operation.
Figure 10B:
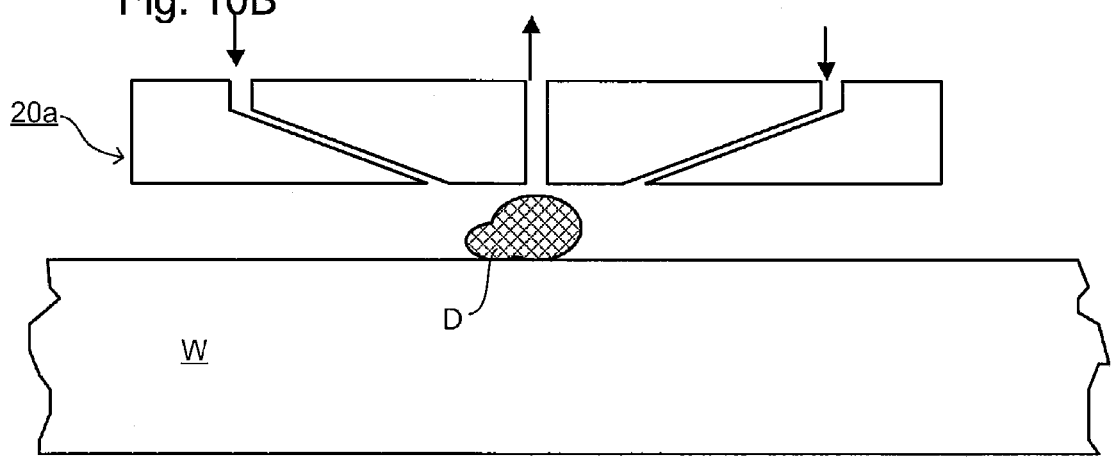
Figure 10C:
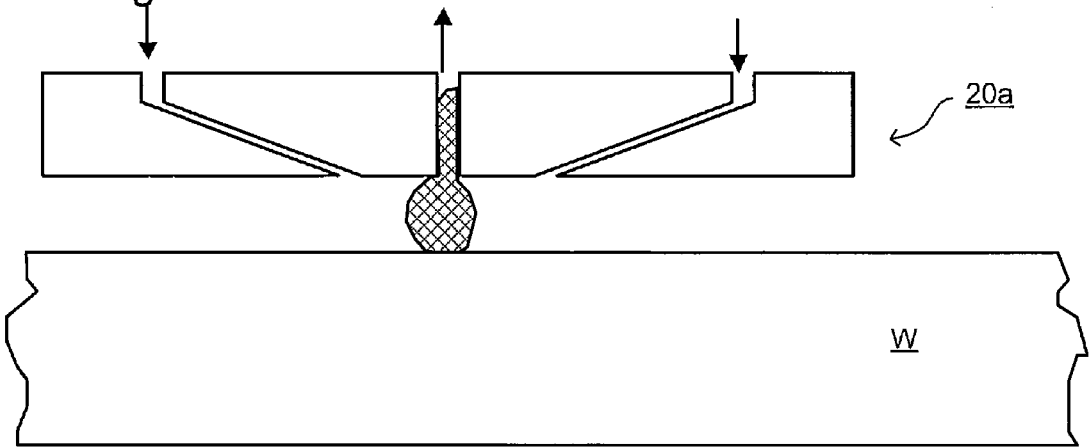

FIGS. 10A to C show the operation of a droplet remover according to an embodiment of the invention in another mode. In this mode, both angled conduits 22, 26 are connected to the gas supply 27. The conduits 22, 26 may supply gas to form angled gas knives. The middle conduit 23 is connected to the vacuum source 28. The extraction areas formed by each gas knife are spaced apart from each other and the extraction outlet, opening 23a, so that a droplet d in one of the extraction areas would interact with an under pressure formed around the outlet through which fluid is extracted. Thus, one of more of the relative angles of the angled conduits 22, 26, the distance between the openings 22, 23, 26, and the relative gas flows therethrough may be altered to obtain desirable positions of the extraction areas relative to each other and the extraction outlet, opening 23a. The arrangement may be optimized to that droplets d may be trapped between the gas knives. In trapping the droplets d, the gas knives hold the droplets d in a location. Where the droplet remover 20 is located near an immersion reservoir, in the location the droplets d are prevented from colliding with the meniscus of the immersion reservoir.

The trapped droplets d may coalesce into a larger droplet. A larger droplet may more easily be extracted than a smaller one for a given under pressure. This is desirable as it makes it much easier to extract droplets, especially where a droplet d could bounce off a gas knife (for example where the droplet d is moving at an angle on the substrate surface relative to the direction of motion between the droplet remover 20a and the substrate W). The optimization may account for other variables such as the relative speed between the substrate W and the droplet remover 20a and the height of the undersurface above the substrate W. In one embodiment, the gas knives meet below the opening of the middle conduit 23.

As can be seen in FIGS. 10A to 10C, as the substrate W moves underneath the droplet remover 20a, rightwards as illustrated, droplets d on the substrate surface are trapped between the two gas knifes. The droplets d amalgamate into a single larger droplet D. The droplet D is extracted with minimal evaporation. As this arrangement is symmetrical, it works equally well whichever direction the substrate W is scanned. A droplet d may pass the first gas knife it encounters. The first gas knife is angled so the gas flow is in the same direction as the movement of the droplet d relative to the droplet remover 20a. However, the droplet d is held by the second gas knife. The gas flow of the second gas knife is angled to oppose the movement of the droplet d relative to the droplet remover 20a. If the droplet d rebounds off the gas flow of the second gas knife, it is then held by the gas flow of the first gas knife.

The droplet remover may be used for several different purposes and provided at different positions in a lithographic apparatus or as a standalone device accordingly. For example, the droplet remover may be used to remove a droplet that has escaped from the supply and confinement structure of a localized liquid supply system (of any of the liquid supply system types described above) during exposure of a substrate. The droplet remover may be provided close to the liquid supply system. The droplet remover may be an integral component of the liquid supply system. The droplet remover may be in a position such that it follows the liquid supply system across the substrate and sweeps up any escaped droplets left behind. The droplet remover may additionally or alternatively be placed so that it is in front of the liquid supply system. It thus removes any droplets before they meet the meniscus of the immersion liquid confined beneath the projection system. This would help avoid the generation of bubbles which may become entrained in the immersion liquid between the projection system and the substrate.

Where, as is normally the case, the substrate may be scanned under the projection system in more than one direction, the droplet remover may surround the entire confinement structure. The droplet remover may have multiple droplet removers enclosing the liquid supply system. They may be provided and selectively activated as the scanning direction changes. At the point between adjoining droplet removers, an extraction outlet as described in U.S. patent application no. U.S. Ser. No. 11/987,569, filed Nov. 30, 2007, titled "LITHOGRAPHIC APPARATUS AND DEVICE MANUFACTURING METHOD" may be provided. The extraction outlet is present to collect liquid that may pass between the gas knives of the adjoining droplet removers.

Alternatively or additionally, the combination of at least one component of the liquid supply system and the droplet remover may be rotated as the scanning direction changes.

Figure 11:
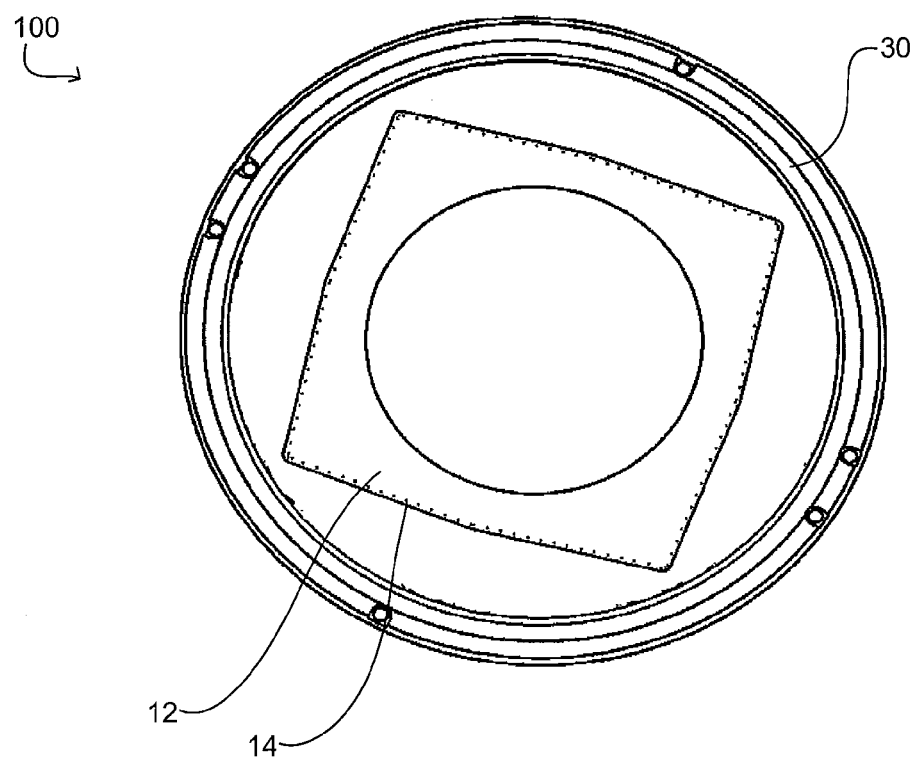
FIG. 11 is a perspective, underneath view of a structure configured to supply and at least partly confine immersion liquid which includes a droplet removal device according to an embodiment of the invention.
Figure 12:
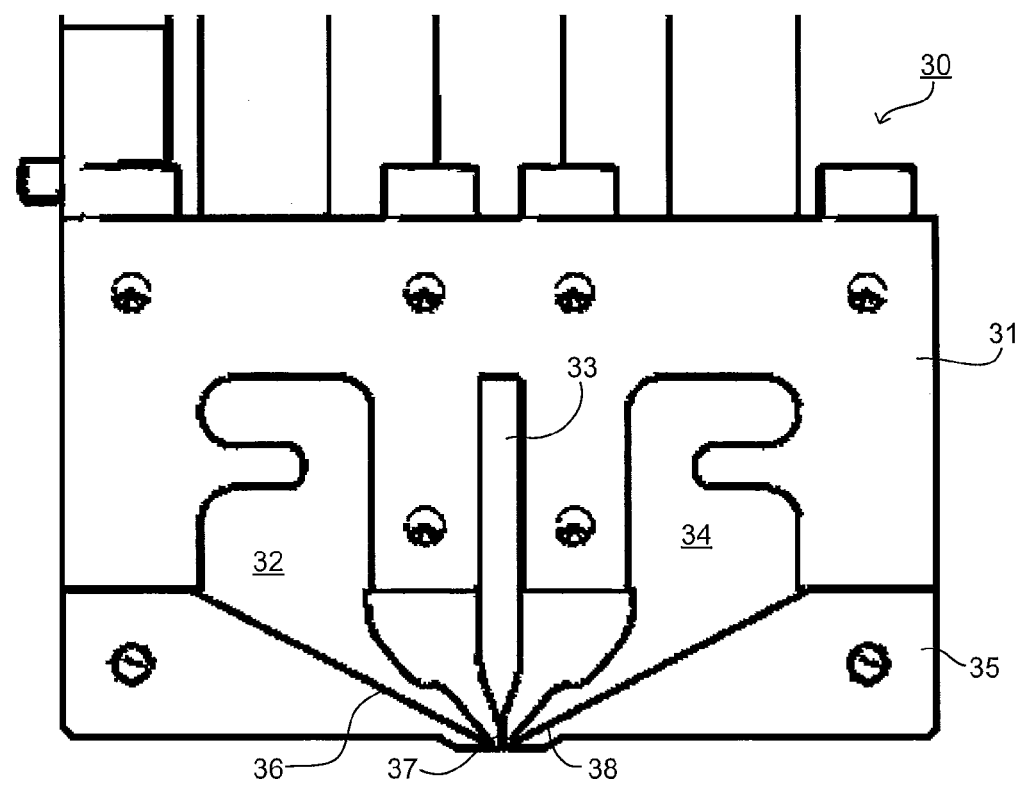
FIG. 12 depicts in cross-section the droplet removal device of FIG. 11.

In FIGS. 11 to 13 is shown an embodiment of the invention in which a droplet remover is incorporated in a structure 100 configured to supply and at least partly confine liquid between a substrate W and the projection system PS. FIG. 11 is a perspective view of the undersurface of the structure 100. The face shown in the drawing in use normally faces downwards towards the substrate W. The droplet remover 30 surrounds a series of dual phase extractor outlets 14. The openings of the droplet remover 30 are radially outward of the extractor outlets 14. The dual phase extractor outlets 14 define the edge of the immersion reservoir between the structure 100 and the substrate W and so confine the immersion liquid there within. In the depicted embodiment the liquid extractors that define the meniscus of the reservoir are dual phase extractors, extracting immersion liquid with gas from the surrounding environment. However the extractors may be single phase extractors, as described in United States patent application publication no. US 2006/0087630.

In the depicted embodiment, the droplet remover 30 may be any of the embodiments described in reference to FIGS. 6 to 10. The droplet remover 30 may have two openings 22a, 23a or three openings 22a, 23a, 26a. The openings may be adjacent each other. The openings 22a, 23a, 26a of the depicted droplet remover 30 are continuous. However, the openings may discontinuous, in the form of a series of slots or long slits. In one embodiment each opening may form an annular slit. It is desirable that any opening that defines a gas knife inlet is a long slit to minimize the number of liquid extractors which may be required to collect liquid escaping between adjoining gas knife inlets. Such inlets may also be overlapped, as viewed from the center of the structure 100, to minimize or eliminate any liquid escapes. In one embodiment, the droplet remover 30 comprises two components. Together the components surround the liquid meniscus at, for example, extractors 14. Each component is operable during scanning when the component trails the meniscus to collect trailing droplets. In another embodiment, the droplet remover has four components or segments. At least two of the segments are operable during relative movement between the substrate and the droplet remover. The two that are operable are the two that trail the immersion reservoir during scanning, and stepping between subsequent scans. In another embodiment, the entire droplet remover (as one entity or a plurality of segments) around the immersion reservoir operates whatever the direction of relative motion between the substrate and the droplet remover. The droplet remover may have any shape when surrounding the immersion meniscus. It may be desirable for the droplet remover to be extended in the scanning direction so that it has a similar outline to the meniscus as described in U.S. patent application no. U.S. 60/996,878, filed Dec. 10, 2007, titled "LITHOGRAPHIC APPARATUS AND DEVICE MANUFACTURING METHOD".

The droplet remover may be used in a fluid remover or dryer, such as a drying station (not shown). The dryer may be part of a bath type or all wet immersion system, as described above, where immersion liquid is not confined to a portion of the substrate, but may flow over the surface of the substrate. In the dryer, the droplet remover removes liquid present on the surface of a substrate. The drying may occur after exposure of the substrate is complete and before the substrate leaves the lithographic apparatus for processing elsewhere on the track, for example, for development, coating, baking and etching. The drying may occur after measurement in a metrology system where immersion liquid is used to replicate an immersion environment.

The droplet remover may be the operative part of a dryer. To operate the dryer, the dryer may pass over a substrate that has been removed from the immersion system. In another embodiment, the dryer passes over the substrate once immersion liquid has been drained from the immersion system and/or the liquid supply to the immersion system has stopped. The liquid covering the substrate may break from a film to form many droplets. As the dryer passes over the substrate surface, liquid present on the substrate is removed by the droplet extractor, drying the surface.

In one embodiment of dryer, the droplet remover has two conduits: one for extraction of liquid and gas, and the other for supplying gas. One conduit is acutely angled with respect to an undersurface of the droplet remover. One conduit may be perpendicular to the undersurface of the droplet remover. The angled conduit may be connected to an extractor. The perpendicular extractor may be connected to a gas supply. The supply conduit and extractor conduit may be connected to a controller so that the rate of flow of gas and the flow of gas and/or liquid, respectively, may be controlled. This is depicted in FIG. 7, where the functions of the conduits are reversed and the body 21 is the body of the dryer.

In an embodiment, the dryer has three conduits. The middle conduit is perpendicular to the undersurface of the dryer and is connected to a gas supply. The other two conduits are angled and are connected to extractors. The conduits are connected to a controller to control the rate of fluid therethrough. This is depicted in FIG. 8, where the body 21 is the body of the dryer.

It is desirable to have a controller associated with a dryer so that the rate of fluid flow can be altered. This may allow better control of the drying process. For example, it may be noted that better drying may be achieved when as much or desirably more fluid is supplied than extracted. The controller enables the functions of a conduit to change between supplying gas and extracting fluid, and/or the droplet remover to change between different modes of operation. Different beneficial modes of drying may be used as required, for example in changing between the two modes of operation of FIGS. 6 and 7, or between the two modes of operation described for a dryer above in connection with FIGS. 8 and 9.

FIG. 12 shows a droplet remover 30 in cross-section. The body of the droplet remover 30 is formed by two parts: a main body 31 and a cover plate 35. The main body 31 defines chambers 32, 33 and 34. The main body 31 provides fluid connections between each of the chambers 32, 33 and 34 and a gas supply (not shown) and/or vacuum source (not shown). The cover plate 35 closes the chambers 32, 33, 34 and defines conduits 36, 37 and 38. An end of each of the conduits 36, 37, 38 opens into a lower face 35a of the droplet remover 30, each defining an opening. Near its opening the middle conduit 37 is substantially perpendicular to the face 35a. Near the openings of the conduits 36 and 38 each conduit is at an acute angle to the face 35a and oriented so that if continued they would intersect underneath the central conduit 37.

Figure 13A:
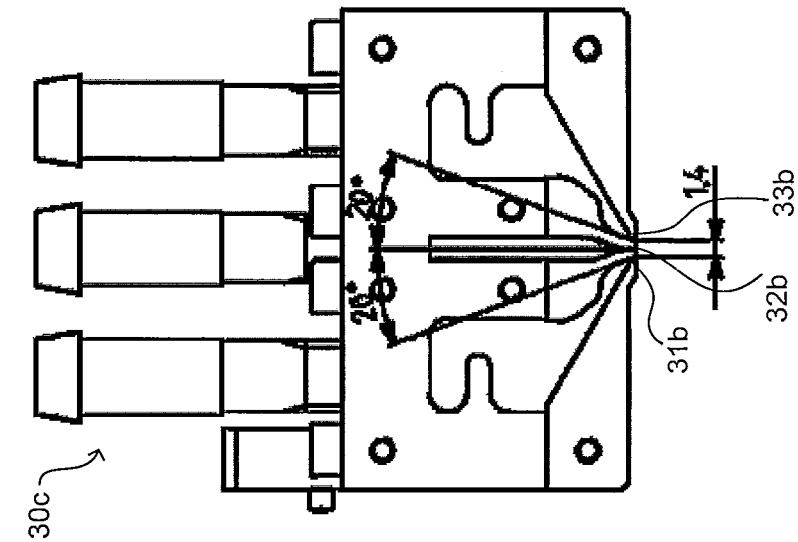
FIGS. 13A to C depict, in cross-section, variants of the droplet removal device of FIGS. 11 and 12.
Figure 13B:
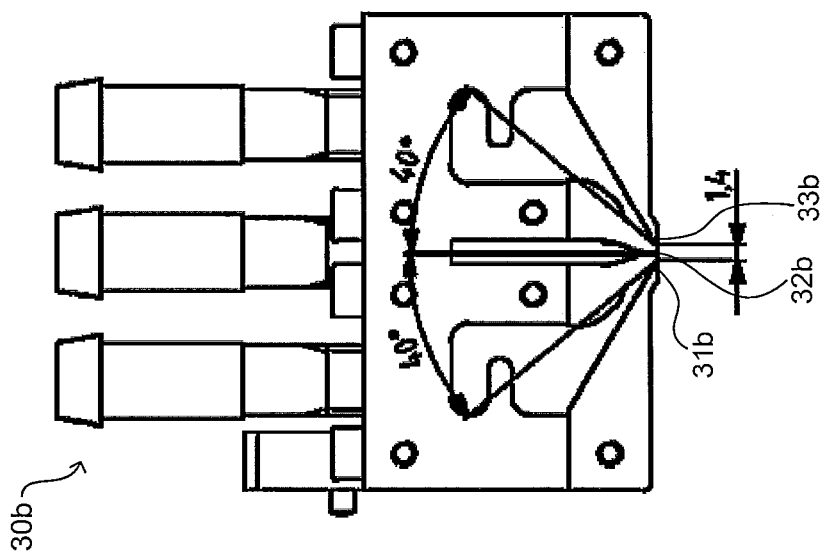
Figure 13C:
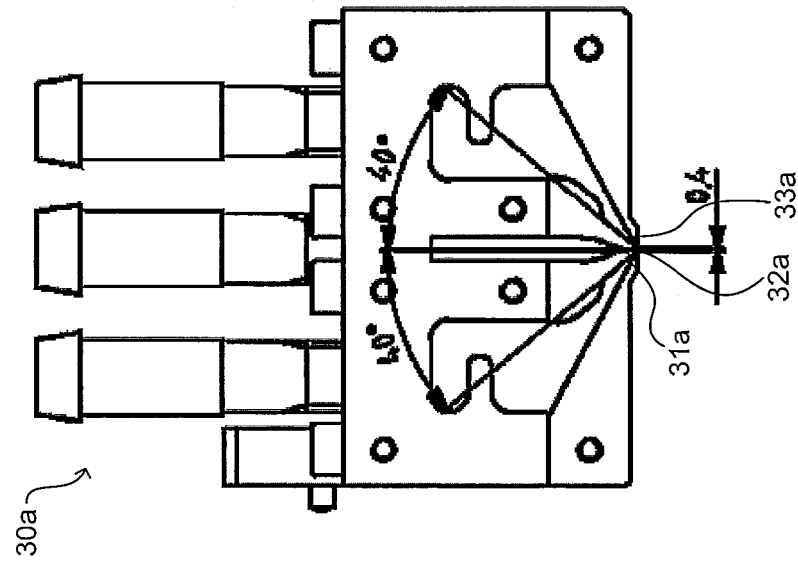

As shown in FIGS. 13A to 13C, different cover plates 35 may be used to provide different conduit geometries with different conduit angles, spacings and widths. In these arrangements, the middle conduit is perpendicular to the surface of face 35a, but in other embodiments this need not be the case. The included angle between each of the angled conduits and the perpendicular conduit may be in the range of 0 to 75°, 10 to 60° or 15 to 45°. The spacing between the centers of the two angled slits at the face 35a may be in the range of from 0.1 mm to 10 mm, 0.2 mm to 5 mm, or 0.5 mm to 2 mm. The slits may have widths in the range of from 5 μm to 500 μm.

The droplet remover is, in an embodiment, arranged so that each of the chambers 32, 33, 34 can be selectively connected to a gas source, a vacuum source or closed off and connected to neither source. Multiple gas and vacuum sources, pressure limiters and/or flow restrictors may be provided to control the over- and under-pressures in the chambers and flow rates. A controller (not shown) may be provided to control the connections between the chambers and the sources automatically, e.g. in conjunction with movements of the substrate and/or exposures, in response to user commands, and/or in response to sensor signals. The sensor signals may be provided by one or more sensors in and/or around the droplet remover. There may be a sensor to sense physical characteristics indicative of pressure, temperature, position and/or flow rates. In this way, the three slits may be selectively operated to supply gas, extract gas and/or liquid or be inactive. There are therefore 27 possible modes of operation of the device set out in Table 1 below. Only certain of these modes are particularly useful, in different circumstances.

TABLE 1

Useful Modes of Operation, referring to conduits 36, 37 and 38 as 1, 2 and 3 respectively.

| Mode | Supply | | | Extract | | | Useful? |
|---|---|---|---|---|---|---|---|
| 1 | 1 | 2 | 3 | | | | n |
| 2 | 1 | 2 | | | | 3 | y |
| 3 | 1 | 2 | | | | x | n |
| 4 | 1 | | 3 | | 2 | | y |
| 5 | 1 | | 3 | | X | | n |
| 6 | 1 | | | | 2 | 3 | y |
| 7 | 1 | | | | X | 3 | y |
| 8 | 1 | | | | 2 | x | y |
| 9 | 1 | | | | X | x | n |
| 10 | | | | 1 | X | x | y |

TABLE 1-continued

Useful Modes of Operation, referring to conduits 36, 37 and 38 as 1, 2 and 3 respectively.

| Mode | Supply | | | Extract | | | Useful? |
|---|---|---|---|---|---|---|---|
| 11 |   |   |   | 1 | 2 | 3 | y |
| 12 |   |   |   | 1 | 2 | x | y |
| 13 |   |   |   | 1 | X | 3 | y |
| 14 |   | 2 | 3 | 1 |   |   | y |
| 15 |   | 2 | 3 | x |   |   | n |
| 16 |   | 2 |   | 1 |   | 3 | y |
| 17 |   | 2 |   | 1 |   | x | y |
| 18 |   | 2 |   | x |   | 3 | y |
| 19 |   | 2 |   | x |   | x | n |
| 20 |   |   |   | x | 2 | x | y |
| 21 |   |   |   | x | 2 | 3 | y |
| 22 |   |   | 3 | 1 | 2 |   | y |
| 23 |   |   | 3 | x | 2 |   | y |
| 24 |   |   | 3 | 1 | X |   | y |
| 25 |   |   | 3 | x | X |   | n |
| 26 |   |   |   | x | X | 3 | y |
| 27 | X | X | X | x | X | x | n |

Modes 4, 14, 16, 17, 22, 23 and 24 are found to be particularly useful in an embodiment of the invention.

In the above embodiments, the droplet remover comprises a body in which two or more conduits are defined. However, it will be appreciated that the conduits may be defined by any equivalent construction, for example using two or more bodies, or a suitable number of plates and/or tubes. Further, the conduits may be formed as separate entities terminating in nozzles or nozzle-like parts that are arranged to direct or receive fluid-flows at the desired angles relative to the surface of a substrate from which droplets are to be removed.

Embodiments of the invention, and other devices employing gas knives, are generally positioned very close to the substrate during operation. Such close proximity may cause problems, e.g. a risk of collision between the substrate and the device employing the gas knife or the formation of menisci between the non-operating device and the substrate. Such undesired menisci may lead to defects in manufactured device. In an embodiment of the invention, the gas knife device is automatically retracted when not in use. Where the gas knife device is part of a droplet remover, the droplet remover may be automatically retracted when the droplet remover is not in use.

Figure 14:
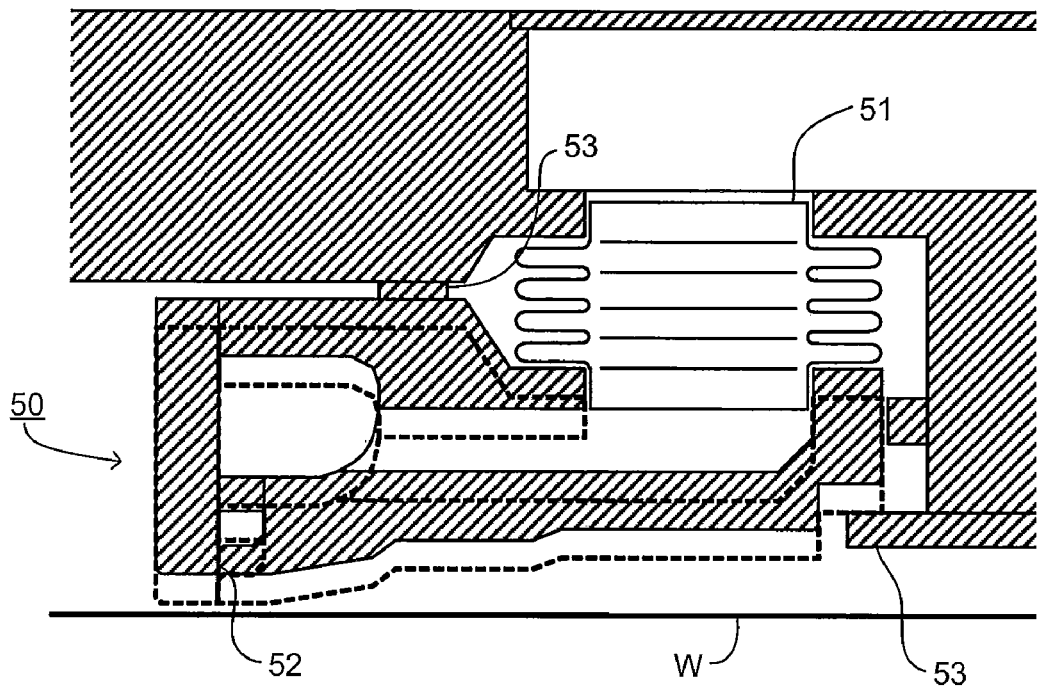
FIG. 14 depicts in cross-section a retractable device including a gas knife.
Figure 15:
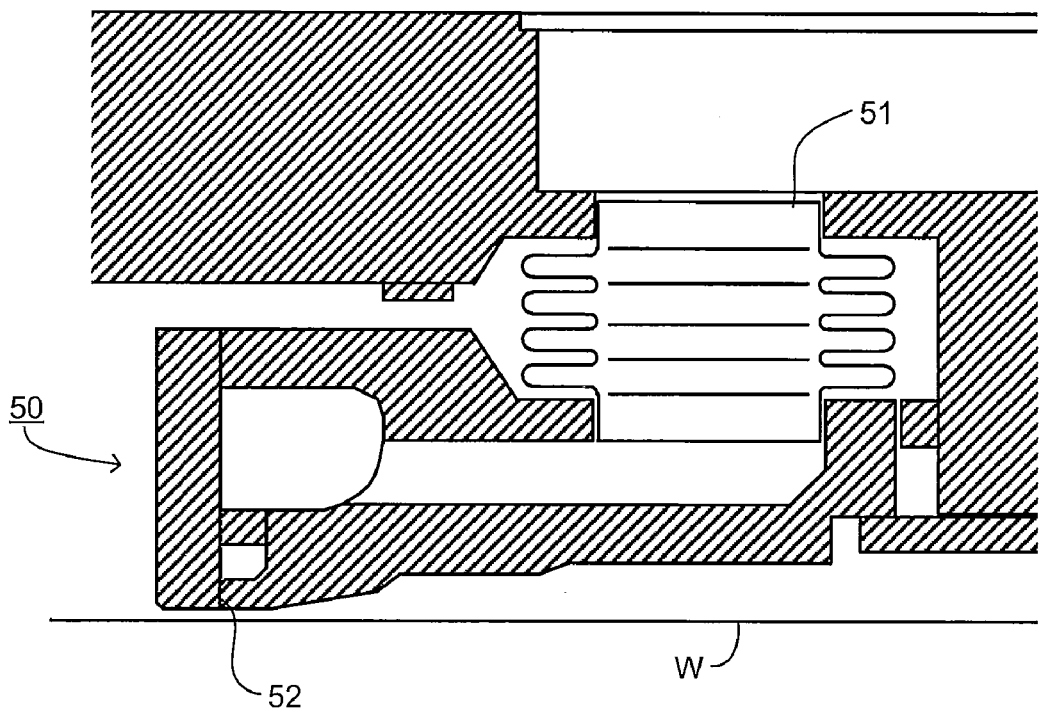
FIG. 15 depicts in cross-section the retractable device of FIG. 14 in an active position.

A particular arrangement for this is shown in FIGS. 14 and 15. In this device, a bellows 51 is provided in the gas supply path to the gas knife 50 and also serves to connect the moveable gas knife 50 forming part of the device to a fixed path. The bellows 51 is made of an elastic material, e.g. metal or rubber, and contracts when not loaded, holding up the moveable part 52 of the device. When the gas knife 50 is activated, increased pressure in the gas supply path causes the bellows to expand, as shown in FIG. 15. The expanding bellows 51 moves the moveable part 50 of the device to its operating position. Activating the gas knife 50 thus operates the bellows to move the gas knife 50 into its operating position. Switching off the gas knife 50 releases the pressure in the gas supply path and the elasticity of the bellows 51 pull back the moveable part 52 of the device to its non-operating position. The bellows 51 is a resilient gas knife retractor. On de-activating the gas knife 50, the bellows 51 retracts the gas knife 50. One or more stops 53 may be provided to limit the movement of the moveable part 52.

Figure 16:
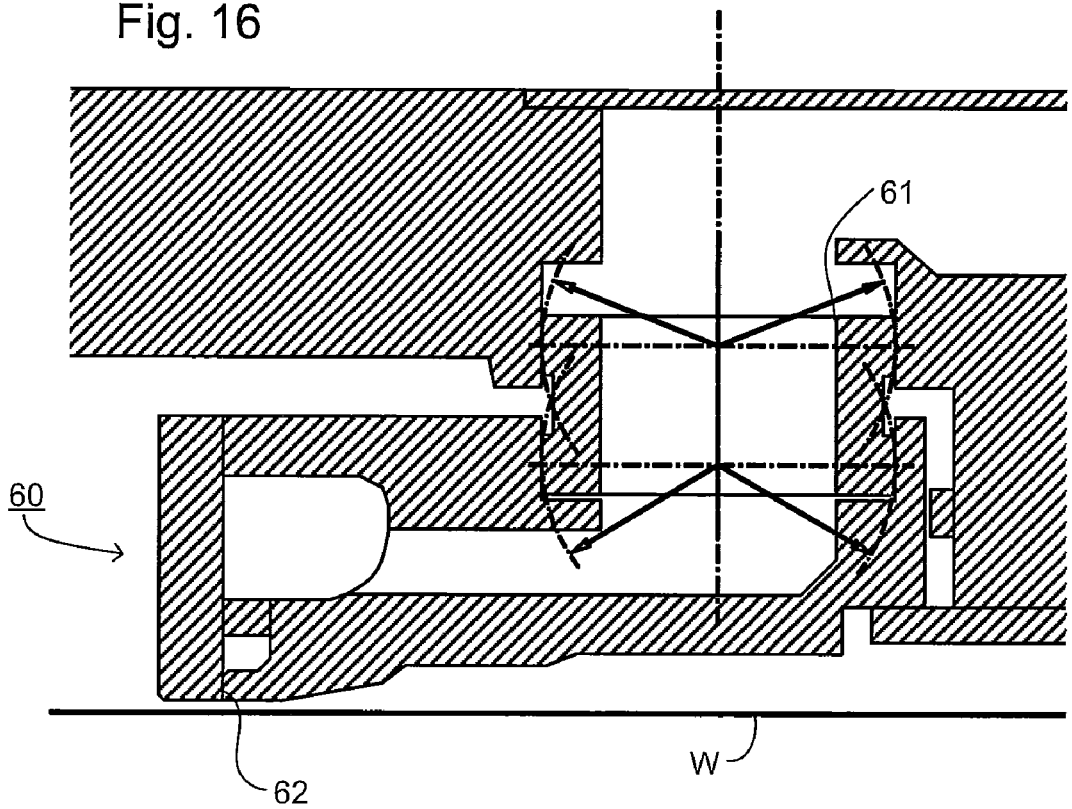
FIG. 16 depicts in cross-section another retractable device including a gas knife.
Figure 17:
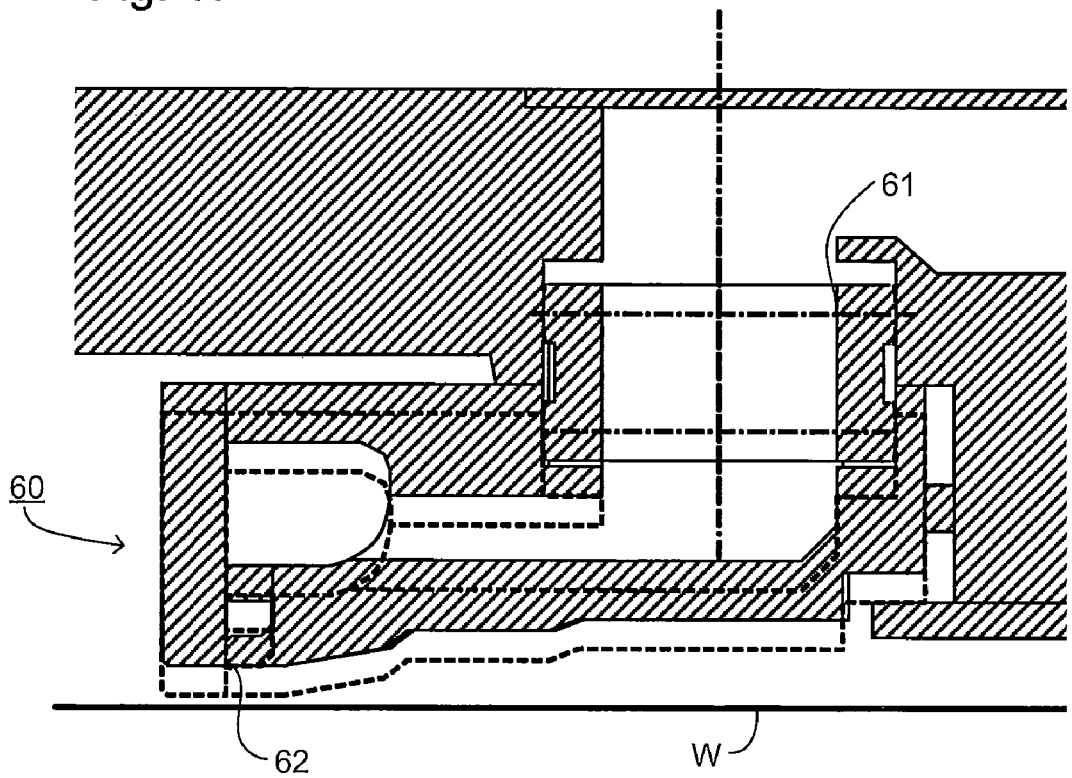
FIG. 17 depicts in cross-section the retractable device of FIG. 16 in an inactive position.

A similar effect can be achieved with a free piston 61, as shown in FIGS. 16 and 17. In an embodiment, the piston 61 has outer ends that conform to parts of spheres centered on the axis of the piston 61 so as to accommodate a small amount of lateral movement of the moveable part 62. Activation of the gas knife 60 generates a force. The force urges the moveable part 62 downwards. A spring (not shown) is provided. The spring retracts the movable part 62 when the gas knife 60 is switched off and the downward force therefore is removed.

In these embodiments, the gas knife is fitted with an automatic retractor. Activation of the gas knife operates the retractor to move the gas knife into its operating position. Deactivation of the gas knife causes the retractor to retract the gas knife.

In a conventional gas knife, the gas flow is directed onto the surface where the gas knife is to be formed perpendicularly to that surface. This means that the gas flows away from the pressure peak more-or-less equally to both sides of the gas knife, although a structure in the vicinity of the gas knife may affect this to some extent. If the gas knife is used to confine liquid to one side, the gas flowing away to the other side does not contribute to confining the liquid. Such a gas knife is therefore inefficient.

Figure 18:
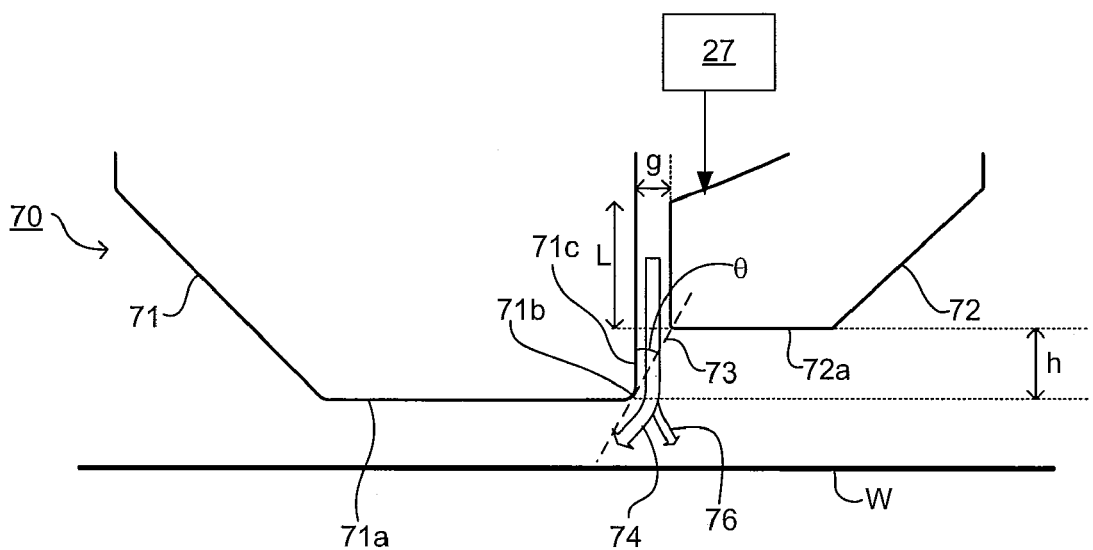
FIG. 18 depicts in cross-section a gas knife according to an embodiment of the invention.

A gas knife 70 according to an embodiment of the invention is shown in FIG. 18, which is a schematic cross-section. In this embodiment, a gas knife outlet is defined by a first member 71 and a second member 72. The first member 71 defines one side (the left in the drawing) of the gas knife outlet and the second member 72 defines the other side (the right in the drawing). In the case that gas knife 70 is to form a closed loop, the first member 71 may define the inner side and the second member 72 may define the outer side. In an embodiment, both the first and second members 71, 72 have the form of an annulus so that the gas knife 70 is substantially circular.

As can be seen in FIG. 18, the undersurface 71a, that is the surface opposing the element (e.g. substrate W) on which the gas from the gas knife 70 is directed, of first member 71 is at a different distance from substrate W than is the undersurface 72a of second member 72. In particular, the distance between surface 71a and substrate W is less than the distance between surface 72a and substrate W. The effect of this difference in height is that the effective orifice 73 (indicated by the dashed line) of the gas knife 70 is at an acute angle θ to the normal to the substrate W. In an embodiment, the height difference h is greater than or equal to twice the width g of gap between first member 71 and second member 72. In an embodiment the angle θ is greater than or equal to about 26°. In an embodiment, the length L of the nozzle above orifice 73 is at least 30 times the width g in order to ensure a linear gas flow exits the orifice 73. This is not shown to scale in FIG. 18.

In operation, when the gas knife 70 is connected to a gas source 27, the gas flow out of the orifice 73 preferentially sticks to the side surface 71c of first member 71 due to the Coandă effect, which is the tendency of a fluid jet to stay attached to an adjacent curved surface that is well shaped. The gas flow therefore tends to bend around the corner 71b. This corner 71b may be radiused to encourage this but this is not essential. As a result of this, the greater part 74 of the gas flow leaving the orifice 73 goes toward the side of the first member 71 and only a smaller part 76 of the gas flow goes toward the side of the second member 72. In an embodiment, about 66.6% of the gas flow leaving the orifice 73 is directed toward the side of first member 71, compared with about 50% of the gas flow when there is no height difference between undersurfaces of two sides. If gas knife 70 is used to confine liquid to a space or to displace liquid in a particular direction, its efficiency is increased, i.e. a lower total gas flow can be used for the same effect. Because more gas flow flows toward the side of the first member 71 (inwardly), this gives better performance of the gas knife 70.

An advantage of this embodiment is that the first and second members 71, 72 can be made separately and joined together after all machining, which is cheaper and easier to manufacture. This reduces the chance of contamination compared to a gas knife with a flat orifice for which it may be necessary to perform a machining or polishing step with the two members attached together.

Gas knife 70 may be used in a liquid handling structure, a liquid confinement structure or a drying device, and in particular in any of the embodiments described above.

In an aspect, there is provided an immersion lithographic apparatus comprising a substrate table constructed to hold a substrate, a projection system configured to project a patterned radiation beam onto a target portion of the substrate, a liquid handling structure configured to supply and at least partly confine a liquid to a space between the projection system and the substrate and/or substrate table, and a device configured to remove liquid from the substrate and/or substrate table, the device comprising a body having a face arranged to be positioned proximate to and opposing a surface of the substrate and/or substrate table, wherein the body defines a first conduit and a second conduit, both opening in the face, the first conduit, the second conduit, or both the first and second conduits, having a part at the opening thereof that is arranged at an acute angle to a normal to the face, and fluid conduits connecting each of the first and second conduits to a vacuum source, a gas source, or both a vacuum source and a gas source, wherein the device configured to remove liquid is positioned in the apparatus so that it can remove liquid from a part of the substrate and/or substrate table at the same time that the patterned radiation beam is projected onto the substrate. Optionally, the acute angle is in the range of from 0 to 65°, desirably from 10 to 55°, more desirably from 20 to 45°, most desirably from 15 to 45°. Optionally, the first conduit and/or the second conduit has a part at the opening thereof that is arranged at an angle in the range of from 0 to 5° to the normal to the face. Optionally, the body further defines a third conduit, wherein the second conduit is between the first conduit and the third conduit. Desirably, the third conduit is arranged at an acute angle to a normal to the face at its opening. Desirably, the angle between the first conduit and the normal is the same as the angle between the third conduit and the normal. Optionally, the first conduit is arranged such that gas flowing out of the first conduit flows in a direction toward the second conduit. Optionally, the apparatus further comprises a controller arranged to selectively connect each of the conduits to either one of the vacuum source and gas source. Optionally, the device is fixed in position relative to the liquid handling structure. Optionally, the device is spaced from the liquid handling structure. Optionally, the apparatus further comprises a second device configured to remove liquid from the substrate and/or substrate table while the patterned beam is projected onto the substrate. Optionally, the apparatus further comprises the vacuum source and the gas source. Optionally, the device is configured to remove liquid in the form of droplets. Optionally, the opening of the first conduit is adjacent the opening of the second conduit. Optionally, the openings of the first and second conduits are radially outward of an extractor outlet used to define a meniscus of liquid in the space. Optionally, each of the openings of the first and second conduits are acutely angled with respect to a normal from the face. Optionally, a conduit functioning as an extractor is angled acutely with respect to the normal.

In an aspect, there is provided a device manufacturing method comprising projecting an image of a pattern onto a substrate through a liquid confined to a space adjacent the substrate, and simultaneously removing liquid from the substrate and/or a substrate table using a flow of gas directed onto the substrate and/or substrate table at an acute angle to the substrate and/or substrate table.

In an aspect, there is provided an immersion lithographic apparatus comprising a liquid handling structure configured to supply and at least partly confine liquid to a space between a projection system and a substrate and/or a substrate table, the substrate table constructed to hold the substrate and the projection system configured to project a patterned radiation beam onto a target position of the substrate, a device configured to remove liquid from a surface of the substrate and/or substrate table, the device defining first and second conduits, each of the first and second conduits defining an opening in a face, the face being arranged to be positioned proximate to and opposing the surface of the substrate and/or substrate table, wherein each of the first and second conduits at its opening is angled away from the other of the first and second conduits and the face, and the first conduit, the second conduit, or both the first and second conduits, being selectively connectable to each of a vacuum source and a gas source. Optionally, the apparatus further comprises a controller arranged to control connection of each of the first and second conduits to the vacuum source and the gas source. Optionally, a third conduit is defined in the device and has an opening in the face, the third conduit being angled at its opening away from the face, the third conduit being selectably connectable to the vacuum source, the gas source, or both the vacuum source and the gas source.

In an aspect, there is provided a liquid remover configured to remove liquid from a surface of a substrate situated on a substrate table and/or from the substrate table, the liquid remover defining first and second conduits, each of the first and second conduits defining an opening in a face, the face being arranged to be positioned proximate to and opposing a surface of the substrate and/or substrate table, wherein each of the first and second conduits, at its respective opening, is angled away from the other of the first and second conduits and the face, and the first conduit, the second conduit, or both the first and second conduits, being selectively connectable to each of a vacuum source and a gas source.

In an aspect, there is provided an immersion lithographic apparatus comprising a liquid handling structure configured to supply and at least partly confine liquid to a space between a projection system and a substrate and/or a substrate table, the substrate table constructed to hold the substrate and the projection system configured to project a patterned radiation beam onto a target position of the substrate, the structure comprising first and second conduits radially outwardly of the space, each of the first and second conduits defining an opening in an undersurface of the structure, wherein each of the first and second conduits at its opening is angled away from the other of the first and second conduits and the undersurface and is selectably connectable to a vacuum source, a gas source, or both a vacuum source and a gas source, to remove liquid from a surface of the substrate and/or substrate table opposing the undersurface.

In an aspect, there is provided a liquid handling structure configured in use to supply and at least partly confine liquid to a space between a projection system and a substrate and/or a substrate table, the substrate table constructed to hold the substrate and the projection system configured to project a patterned radiation beam onto a target position of the substrate, the structure comprising first and second conduits radially outwardly of the space, each of the first and second conduits defining an opening in an undersurface of the structure, wherein each of the first and second conduits, at its respective opening, is angled away from the other of the first and second conduits and the undersurface and is selectably connectable to a vacuum source, a gas source, or both a vacuum source and a gas source, to remove liquid from a surface of the substrate and/or substrate table opposing the undersurface.

In an aspect, there is provided a lithographic apparatus comprising a dryer, wherein the dryer is configured to remove liquid from a surface of a substrate and/or a substrate table, the dryer comprising first and second conduits, each conduit defining an opening in a face, the face being arranged to be positioned proximate to and opposing the surface of the substrate and/or substrate table, wherein each of the first and second conduits at its opening is angled away from the other of the first and second conduits and the face and is selectably connectable to each of a vacuum source and a gas source. Optionally, the lithographic apparatus further comprises a controller configured to control the connection of the conduits to a vacuum source and a gas source.

In an aspect, there is provided a dryer configured to remove liquid from a surface of a substrate and/or a substrate table, the dryer comprising first and second conduits, each conduit defining an opening in a face, the face being arranged to be positioned proximate to and opposing the surface of the substrate and/or substrate table, wherein each of the first and second conduits at its opening is angled away from the other of the first and second conduits and the face and is selectably connectable to each of a vacuum source and a gas source.

In an aspect, there is provided an immersion lithographic apparatus comprising a substrate table constructed to hold a substrate, projection system configured to project a patterned radiation beam onto a target portion of the substrate, a liquid handling structure configured to supply and at least partly confine a liquid to a space between the projection system and the substrate and/or substrate table, and a device configured to remove liquid from the substrate and/or substrate table, the device comprising a first conduit and a second conduit, each of the first and second conduits having a nozzle part having a fluid channel therethrough, the nozzle of the first conduit, the second conduit, or both the first and second conduits, arranged such that a center line of the fluid channel thereof is at an acute angle to a normal to a surface of the substrate and/or substrate table, and fluid conduits connecting each of the first and second conduits to a vacuum source, a gas source, or both a vacuum source and a gas source, wherein the device configured to remove liquid is positioned in the apparatus so that it can remove liquid from a part of the substrate and/or substrate table at the same time that the patterned radiation beam is projected onto the substrate. Optionally, the apparatus further comprises the vacuum source and the gas source.

In an aspect, there is provided a lithographic apparatus comprising a body configured to be positioned proximate to and opposing a surface of a substrate and/or a substrate table, the substrate table constructed to hold a substrate, the body comprising a gas knife device configured to manipulate fluid on the surface of the substrate and/or substrate table, and a retractor configured to retract the gas knife device into the body on de-activation of the gas knife device. Optionally, activation of the gas knife operates the retractor to move the gas knife device into its operating position. Optionally, the gas knife device comprises a liquid remover. Desirably, the liquid remover defines first and second conduits, each of the first and second conduits defining an opening in a face, the face being arranged to be positioned proximate to and opposing a surface of the substrate and/or substrate table, wherein each of the first and second conduits, at its respective opening, is angled away from the other of the first and second conduits and the face, and the first conduit, the second conduit, or both the first and second conduits, being selectively connectable to each of a vacuum source and a gas source. Optionally, the gas knife device comprises a gas knife and the body is a structure configured to supply and at least partly confine liquid between the projection system and the substrate table and/or substrate. Optionally, the retractor comprises a part positioned in a gas path connecting the gas knife device to a supply of gas, the part being configured to expand when a gas pressure therein is higher than a gas pressure outside the part. Desirably, the part is selected from the group comprising a piston and bellows.

In an aspect, there is provided a gas knife device arranged to direct a gas flow against an object surface, the gas knife device comprising a first member and a second member, the first and second member being separated by a gap that defines an orifice through which gas flows to form the gas knife, wherein the orifice is oriented at an acute angle to the normal to the object surface. Optionally, the acute angle is greater than about 26°. Optionally, the first member has a first member surface opposing the object surface and the second member has a second member surface opposing the object surface, the second member surface being substantially parallel to the first member surface, and the distance in a direction perpendicular to the first member surface between the first member surface and the second member surface is greater than or equal to twice a width of the gap in a direction parallel to the first member surface. Optionally, the gap between the first member and the second member defines a nozzle that extends away from the orifice in a direction perpendicular to the object surface for a distance at least 30 times a width of the gap.

In an aspect, there is provided an immersion lithographic apparatus comprising a substrate table constructed to hold a substrate, a projection system configured to project a patterned radiation beam onto a target portion of the substrate, and a liquid handling structure configured to supply and at least partly confine a liquid to a space between the projection system and the substrate and/or substrate table, the liquid handling structure including the above gas knife device.

In an aspect, there is provided a dryer configured to remove liquid from a surface of a substrate and/or a substrate table, the dryer comprising the above gas knife device.

In an aspect, there is provided an immersion lithographic apparatus comprising: a liquid handling structure configured to supply and at least partly confine liquid to a space between a projection system and a substrate and/or a substrate table, the substrate table constructed to hold the substrate and the projection system configured to project a patterned radiation beam onto a target position of the substrate; a device configured to remove liquid from a surface of the substrate and/or the substrate table, the device defining first and second conduits, each of the first and second conduits defining an opening in a face, the face being arranged to be positioned proximate to and opposing the surface of the substrate and/or substrate table, wherein each of the first and second conduits at its opening is angled away from the other of the first and second conduits and the face, and the first conduit, the second conduit, or both the first and second conduits, being selectively connectable to each of a vacuum source and a gas source.

In an embodiment, the apparatus further comprises a controller arranged to control connection of each of the first and second conduits to the vacuum source and the gas source.

In an embodiment, a third conduit is defined in the device and has an opening in the face, the third conduit being angled at its opening away from the face, the third conduit being selectably connectable to the vacuum source, the gas source, or both the vacuum source and the gas source.

In an aspect, there is provided a lithographic apparatus comprising a dryer, wherein the dryer is configured to remove liquid from a surface of a substrate and/or a substrate table, the dryer comprising first and second conduits, each conduit defining an opening in a face, the face being arranged to be positioned proximate to and opposing the surface of the substrate and/or substrate table, wherein each of the first and second conduits at its opening is angled away from the other of the first and second conduits and the face and is selectably connectable to each of a vacuum source and a gas source.

In an embodiment, the apparatus further comprises a controller configured to control the connection of the conduits to a vacuum source and a gas source.

In an aspect, there is provided an immersion lithographic apparatus comprising: a liquid handling structure configured to supply and at least partly confine liquid to a space between a projection system and a substrate and/or a substrate table, the substrate table constructed to hold the substrate and the projection system configured to project a patterned radiation beam onto a target position of the substrate, the structure comprising first and second conduits radially outwardly of the space, each of the first and second conduits defining an opening in an undersurface of the structure, wherein each of the first and second conduits at its opening is angled away from the other of the first and second conduits and the undersurface and is selectably connectable to a vacuum source, a gas source, or both a vacuum source and a gas source, to remove liquid from a surface of the substrate and/or substrate table opposing the undersurface.

In an aspect, there is provided a lithographic apparatus comprising: a dryer, wherein the dryer is configured to remove liquid from a surface of a substrate and/or a substrate table, the dryer comprising first and second conduits, each conduit defining an opening in a face, the face being arranged to be positioned proximate to and opposing the surface of the substrate and/or substrate table, wherein each of the first and second conduits at its opening is angled away from the other of the first and second conduits and the face and is selectably connectable to each of a vacuum source and a gas source.

In an aspect, there is provided an immersion lithographic apparatus comprising: a substrate table constructed to hold a substrate; a projection system configured to project a patterned radiation beam onto a target portion of the substrate; a liquid handling structure configured to supply and at least partly confine a liquid to a space between the projection system and the substrate and/or substrate table; and a device configured to remove liquid from the substrate and/or substrate table, the device comprising: a first conduit and a second conduit, each of the first and second conduits having a nozzle part having a fluid channel therethrough, the nozzle of the first conduit, the second conduit, or both the first and second conduits, arranged such that a center line of the fluid channel thereof is at an acute angle to a normal to a surface of the substrate and/or substrate table, and fluid conduits connecting each of the first and second conduits to a vacuum source, a gas source, or both a vacuum source and a gas source, wherein the device configured to remove liquid is positioned in the apparatus so that it can remove liquid from a part of the substrate and/or substrate table at the same time that the patterned radiation beam is projected onto the substrate.

In an embodiment, the apparatus comprises the vacuum source and the gas source.

In an aspect, there is provided a lithographic apparatus comprising a body configured to be positioned proximate to and opposing a surface of a substrate and/or a substrate table, the substrate table constructed to hold a substrate, the body comprising: a gas knife device configured to manipulate fluid on the surface of the substrate and/or substrate table; and a retractor configured to retract the gas knife device into the body on de-activation of the gas knife device.

In an embodiment, activation of the gas knife operates the retractor to move the gas knife device into its operating position.

In an embodiment, the gas knife device comprises a liquid remover.

In an embodiment, the liquid remover defines first and second conduits, each of the first and second conduits defining an opening in a face, the face being arranged to be positioned proximate to and opposing a surface of the substrate and/or substrate table, wherein each of the first and second conduits, at its respective opening, is angled away from the other of the first and second conduits and the face, and the first conduit, the second conduit, or both the first and second conduits, being selectively connectable to each of a vacuum source and a gas source.

In an embodiment, the gas knife device comprises a gas knife and the body is a structure configured to supply and at least partly confine liquid between the projection system and the substrate table and/or substrate.

In an embodiment, the retractor comprises a part positioned in a gas path connecting the gas knife device to a supply of gas, the part being configured to expand when a gas pressure therein is higher than a gas pressure outside the part.

In an embodiment, the part is selected from the group comprising a piston and bellows.

In an aspect, there is provided a gas knife device arranged to direct a gas flow against an object surface, the gas knife device comprising a first member and a second member, the first and second member being separated by a gap that defines an orifice through which gas flows to form the gas knife, wherein the orifice is oriented at an acute angle to the normal to the object surface.

In an embodiment, the acute angle is greater than about 26°.

In an embodiment, the first member has a first member surface opposing the object surface and the second member has a second member surface opposing the object surface, the second member surface being substantially parallel to the first member surface, and the distance in a direction perpendicular to the first member surface between the first member surface and the second member surface is greater than or equal to twice a width of the gap in a direction parallel to the first member surface.

In an embodiment, the gap defines a nozzle that extends away from the orifice in a direction perpendicular to the object surface for a distance at least 30 times a width of the gap.

In an aspect, there is provided a an immersion lithographic apparatus comprising: a substrate table constructed to hold a substrate; a projection system configured to project a patterned radiation beam onto a target portion of the substrate; and a liquid handling structure configured to supply and at least partly confine a liquid to a space between the projection system and the substrate and/or the substrate table, the liquid handling structure including any of the gas knife devices herein.

In an aspect, there is provided a dryer configured to remove liquid from a surface of a substrate and/or a substrate table, the dryer comprising any of the gas knife devices herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

It should also be noted that the term "air knife" should not be taken as requiring that air is necessarily used, other gases or mixtures of gases may also be used.

The descriptions above are intended to be illustrative, not limiting. Thus, it will be apparent to one skilled in the art that modifications may be made to the invention as described without departing from the scope of the claims set out below.

The invention claimed is:

1. An immersion lithographic apparatus comprising:
a substrate table constructed to hold a substrate;
a projection system configured to project a patterned radiation beam onto a target portion of the substrate;
a liquid handling structure configured to supply and at least partly confine a liquid to a space between the projection system and the substrate and/or the substrate table; and
a device configured to remove liquid from the substrate and/or the substrate table, the device comprising:
a body having a face arranged to be positioned proximate to and opposing a surface of the substrate and/or the substrate table, wherein the body defines a first conduit and a second conduit, both opening in the face, the first conduit, the second conduit, or both the first and second conduits, having a part at the opening thereof that is arranged at an acute angle to a normal to the face, and
a fluid conduits connecting each of the first and second conduits to a vacuum source, a gas source, or both a vacuum source and a gas source,
wherein the device configured to remove liquid is positioned in the apparatus so that it can remove liquid from a part of the substrate and/or substrate table at the same time that the patterned radiation beam is projected onto the substrate.

2. The apparatus of claim 1, wherein the acute angle is in the range of from 0 to 65°.

3. The apparatus of claim 1, wherein the first conduit and/or the second conduit has a part at the opening thereof that is arranged at an angle in the range of from 0 to 5° to the normal to the face.

4. The apparatus of claim 1, wherein the body further defines a third conduit, wherein the second conduit is between the first conduit and the third conduit.

5. The apparatus of claim 4, wherein the third conduit is arranged at an acute angle to a normal to the face at its opening.

6. The apparatus of claim 5, wherein the angle between the first conduit and the normal is the same as the angle between the third conduit and the normal.

7. The apparatus of claim 1, wherein the first conduit is arranged such that gas flowing out of the first conduit flows in a direction toward the second conduit.

8. The apparatus of claim 1, further comprising a controller arranged to selectively connect each of the conduits to either one of the vacuum source and gas source.

9. The apparatus of claim 1, wherein the device is fixed in position relative to the liquid handling structure.

10. The apparatus of claim 1, wherein the device is spaced from the liquid handling structure.

11. The apparatus of claim 1, further comprising a second device configured to remove liquid from the substrate and/or substrate table while the patterned beam is projected onto the substrate.

12. The apparatus of claim 1, wherein the device is configured to remove liquid in the form of droplets.

13. The apparatus of claim 1, wherein the opening of the first conduit is adjacent the opening of the second conduit.

14. The apparatus of claim 1, wherein the openings of the first and second conduits are radially outward of an extractor outlet used to define a meniscus of liquid in the space.

15. The apparatus of claim 1, wherein each of the openings of the first and second conduits are acutely angled with respect to a normal from the face.

16. The apparatus of claim 1, wherein a conduit functioning as an extractor is angled acutely with respect to the normal.

17. The apparatus of claim 1, wherein the acute angle is in the range of from 10 to 55°.

18. An immersion lithographic apparatus comprising:
a movable table;
a projection system configured to project a patterned radiation beam onto a target portion of a substrate;
a liquid handling structure configured to supply and at least partly confine a liquid to a space between the projection system and the table; and
a device configured to remove liquid above the table, the device comprising:
a body having a face arranged to be positioned proximate to and opposing a surface of the table, wherein the body defines a first conduit and a second conduit, both opening adjacent each other in the face, the first conduit, the second conduit, or both the first and second conduits, having a part at the opening thereof that is arranged at an acute angle to a normal to the face, and
a fluid conduit connecting each of the first and second conduits to a vacuum source, a gas source, or both a vacuum source and a gas source,
wherein the device configured to remove liquid is positioned in the apparatus so that it can remove liquid above a part of the table at the same time that the patterned radiation beam is projected onto the substrate.

19. An immersion lithographic apparatus comprising:
a movable table;
a projection system configured to project a patterned radiation beam onto a target portion of a substrate;
a liquid handling structure configured to supply and at least partly confine a liquid to a space between the projection system and the table; and
a device configured to remove liquid above the table, the device comprising:
a body having a face arranged to be positioned proximate to and opposing a surface of the table, wherein the body defines a first conduit, a second conduit and a third conduit, each conduit opening adjacent at least one of the other openings in the face, the first conduit, the second conduit, and/or third conduits, having a part at the opening thereof that is arranged at an acute angle to a normal to the face, and
a fluid conduit connecting each of the first, second and third conduits to a vacuum source, a gas source, or both a vacuum source and a gas source,
wherein the device configured to remove liquid is positioned in the apparatus so that it can remove liquid above a part of the table at the same time that the patterned radiation beam is projected onto the substrate.

20. The apparatus of claim 19, wherein the angle between the first conduit and the normal is the same as the angle between the third conduit and the normal.

21. The apparatus of claim 19, further comprising a controller arranged to selectively connect each of the conduits to either one of the vacuum source and gas source.

22. An immersion lithographic apparatus comprising:
a movable table;
a projection system configured to project a patterned radiation beam onto a target portion of a substrate;
a liquid handling structure configured to supply and at least partly confine a liquid to a space between the projection system and the table; and
a device configured to remove liquid above the table, the device comprising:
a body having a face arranged to be positioned proximate to and opposing a surface of the table, wherein the body defines a first conduit and a second conduit, both opening adjacent each other in the face, the first conduit, the second conduit, or both the first and second conduits, having a part at the opening thereof that is arranged at an acute angle to a normal to the face and each of the first and second conduits at its opening is angled away from the other of the first and second conduits and the face, and
a fluid conduit connecting each of the first and second conduits to a vacuum source, a gas source, or both a vacuum source and a gas source, the first conduit, the second conduit, or both the first and second conduits, being selectively connectable to each of a vacuum source and a gas source,
wherein the device configured to remove liquid is positioned in the apparatus so that it can remove liquid above a part of the table at the same time that the patterned radiation beam is projected onto the substrate.

23. The apparatus of claim 22, wherein the acute angle is in the range of from 0 to 65°.

24. An immersion lithographic apparatus comprising:
a movable table;
a projection system configured to project a patterned radiation beam onto a target portion of a substrate;
a liquid handling structure configured to supply and at least partly confine a liquid to a space between the projection system and the table; and
a device configured to remove liquid above the table, the device comprising:
a body having a face arranged to be positioned proximate to and opposing a surface of the table, wherein the body defines a first conduit, a second conduit and a third conduit between the first and second conduits, each conduit opening adjacent at least one other conduit in the face, the first and second conduits each having a part at the opening thereof that is arranged at an angle to a normal to the face and each of the first, second and third conduits at its opening is angled away from at least one of the other conduits and the face, and
a fluid conduit connecting each of the first and second conduits to a vacuum source, a gas source, or both a vacuum source and a gas source,
wherein the device configured to remove liquid is positioned in the apparatus so that it can remove liquid above a part of the table at the same time that the patterned radiation beam is projected onto the substrate.

* * * * *